United States Patent
Hayashida et al.

(10) Patent No.: US 10,243,176 B2
(45) Date of Patent: Mar. 26, 2019

(54) METHOD FOR MANUFACTURING ORGANIC EL DISPLAY DEVICE AND ORGANIC EL DISPLAY DEVICE

(71) Applicant: JOLED INC., Tokyo (JP)

(72) Inventors: Yoshiki Hayashida, Osaka (JP);
Kazuhiro Kobayashi, Kanagawa (JP);
Toshiaki Onimaru, Tokyo (JP);
Takayuki Shimamura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/513,619

(22) PCT Filed: Aug. 6, 2015

(86) PCT No.: PCT/JP2015/003961
§ 371 (c)(1),
(2) Date: Mar. 23, 2017

(87) PCT Pub. No.: WO2016/047021
PCT Pub. Date: Mar. 31, 2016

(65) Prior Publication Data
US 2017/0301889 A1    Oct. 19, 2017

(30) Foreign Application Priority Data
Sep. 24, 2014  (JP) ................................ 2014-194007

(51) Int. Cl.
*H01L 27/32*    (2006.01)
*H01L 51/00*    (2006.01)
*H01L 51/56*    (2006.01)

(52) U.S. Cl.
CPC .......... *H01L 51/56* (2013.01); *H01L 27/3246* (2013.01); *H01L 51/0005* (2013.01); *H01L 2251/568* (2013.01)

(58) Field of Classification Search
None
See application file for complete search history.

(56) References Cited

U.S. PATENT DOCUMENTS

| 6,583,584 B2 * | 6/2003 | Duineveld | .......... H01L 27/3246 |
| | | | 313/495 |
| 9,111,886 B2 * | 8/2015 | Miyazawa | .......... H01L 27/3246 |
| (Continued) | | | |

FOREIGN PATENT DOCUMENTS

| JP | 2009-104030 A | 5/2009 |
| JP | 2009-200049 A | 9/2009 |
| (Continued) | | |

OTHER PUBLICATIONS

English translation WO2010013654A1, 11 pgs, retrieved from internet on May 4, 2018: https://patents.google.com/patent/WO2010013654A1/en?oq=2011129283.*

(Continued)

*Primary Examiner* — David E Graybill
(74) *Attorney, Agent, or Firm* — Hauptman Ham, LLP

(57) ABSTRACT

A method for repairing a bank during manufacture of an organic EL display device when a bank defect portion is produced due to collapsing of a bank, a foreign particle, or the like. The method includes: detecting a defect portion of a lengthwise bank formed over a ground substrate; and when a defect portion is detected, forming, in each of adjacent concave spaces between which the lengthwise bank having the defect portion is located, a dam partitioning the concave space into a first space in a vicinity of the bank defect portion and a second portion not in the vicinity of the bank defect portion. The shape of the dam is configured so that in ejecting organic functional layer ink in each concave space with a nozzle head, there is an ink dropping point in each of the first space and the second space.

11 Claims, 23 Drawing Sheets

(56) References Cited

U.S. PATENT DOCUMENTS

| | | | |
|---|---|---|---|
| 9,755,193 B2* | 9/2017 | Onimaru | H01L 27/3246 |
| 9,837,640 B2* | 12/2017 | Hayashida | H01L 51/56 |
| 2003/0011304 A1* | 1/2003 | Duineveld | H01L 27/3246 |
| | | | 313/506 |
| 2005/0127376 A1* | 6/2005 | Young | H01L 27/3225 |
| | | | 257/80 |
| 2009/0160322 A1 | 6/2009 | Yoshida et al. | |
| 2011/0287682 A1* | 11/2011 | Miyazawa | H01L 27/3246 |
| | | | 445/2 |
| 2014/0014913 A1* | 1/2014 | Lee | H01L 21/76894 |
| | | | 257/40 |
| 2017/0012246 A1* | 1/2017 | Onimaru | H01L 27/3246 |
| 2017/0040393 A1* | 2/2017 | Onimaru | H01L 27/3246 |
| 2017/0077460 A1* | 3/2017 | Hayashida | H01L 51/56 |
| 2017/0170244 A1* | 6/2017 | Kobayashi | H01L 27/3246 |
| 2017/0213881 A1* | 7/2017 | Kondo | H01L 51/5228 |

FOREIGN PATENT DOCUMENTS

| | | |
|---|---|---|
| JP | 2010-267576 A | 11/2010 |
| WO | 2010/013654 A1 | 2/2010 |
| WO | 2011/129283 A1 | 10/2011 |

OTHER PUBLICATIONS

International Search Report in PCT/JP2015/003961, dated Nov. 10, 2015.

* cited by examiner

Bank repair

Simultaneous firing

Ink application

Drying

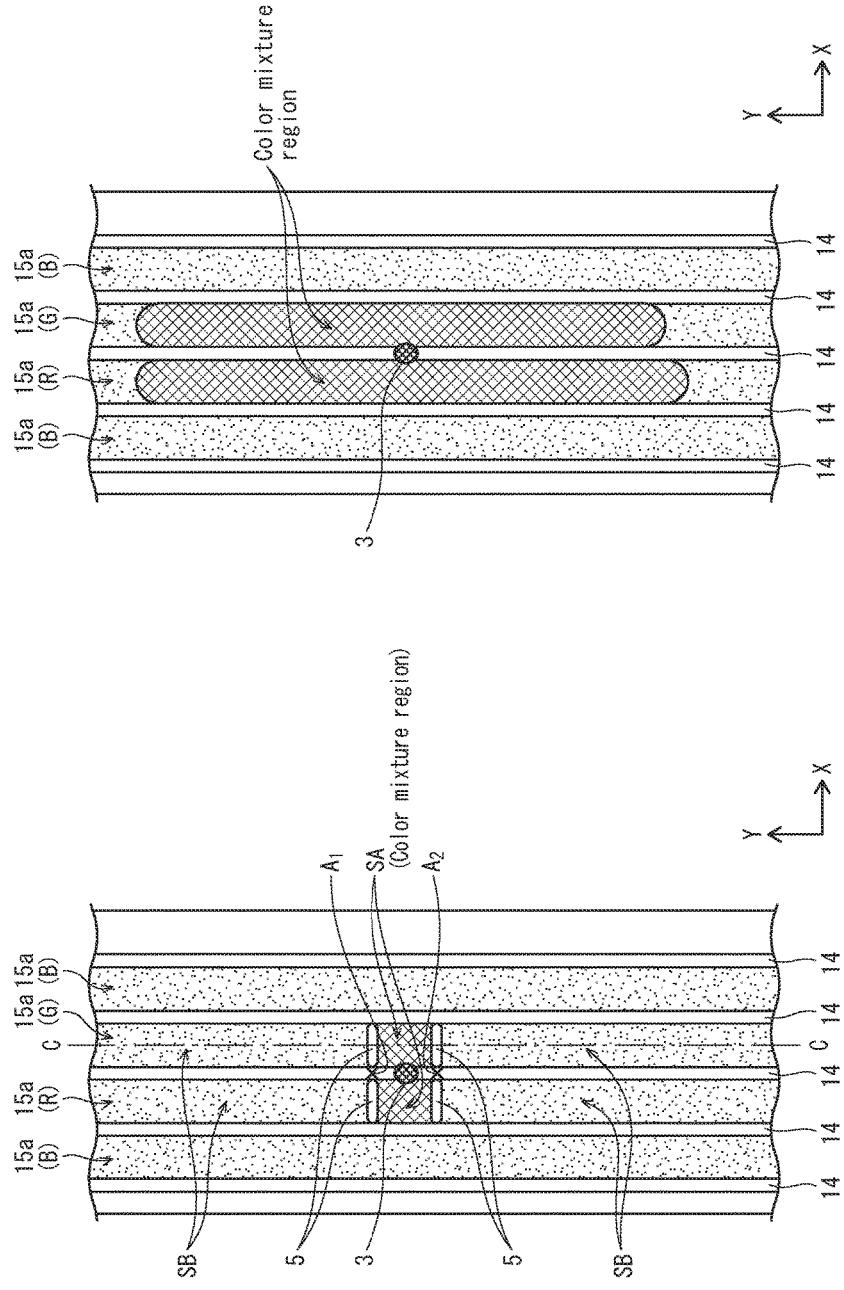

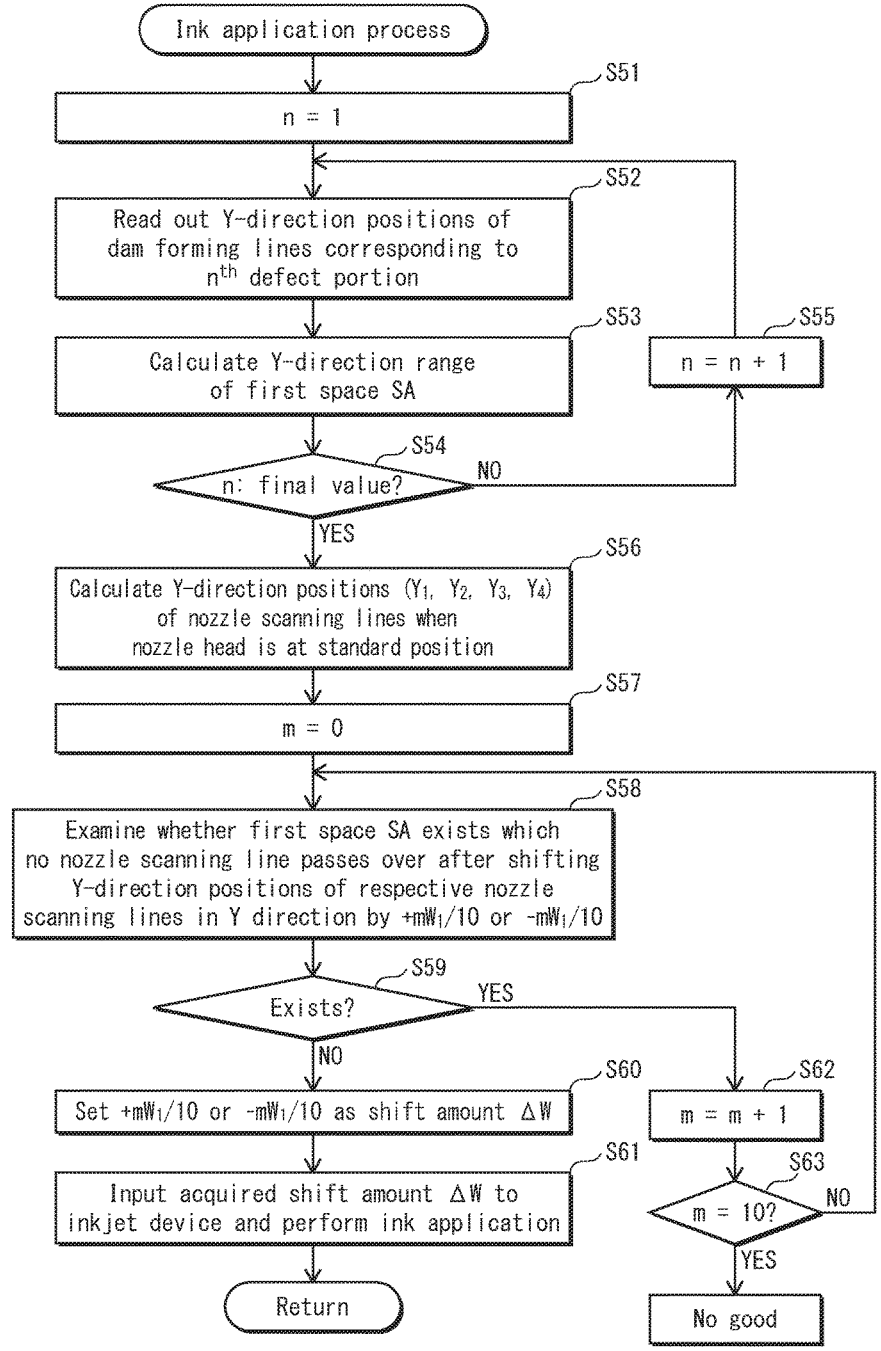

METHOD FOR MANUFACTURING ORGANIC EL DISPLAY DEVICE AND ORGANIC EL DISPLAY DEVICE

RELATED APPLICATIONS

The present application is a National Phase of International Application Number PCT/JP2015/003961, filed on Aug. 6, 2015, which claims priority to Japanese Patent Application Number 2014-194007, filed on Sep. 24, 2014.

BACKGROUND ART

The present invention is related to an organic electroluminescence (EL) display device manufacturing method and an organic EL display device.

TECHNICAL FIELD

In recent years, organic EL display panels including a substrate and a matrix of organic EL elements arranged over the substrate have been put into practical use, as one type of a light-emitting display device. Organic EL display panels achieve high visibility due to the organic EL elements performing light emission individually. Also, organic EL display panels achieve excellent shock resistance due to the organic EL elements being completely solid-state elements.

Organic EL elements in a typical organic EL display panel have a basic structure in which a light-emitting layer containing an organic light-emitting material is disposed between an electrode pair composed of an anode and a cathode. The organic EL elements are driven through voltage application between these electrodes. The organic EL elements are current-driven light-emitting elements, emitting light when holes injected into the light-emitting layer from the anode and electrons injected into the light-emitting layer from the cathode recombine in the light-emitting layer.

In a typical organic EL display panel, a light-emitting layer of one organic EL element is partitioned from a light-emitting layer of an adjacent organic EL element by a bank formed by using an insulative material.

Further, in an organic EL element of a typical organic EL display panel, one or more organic layers, such as a hole injection layer, a hole transport layer, and a hole injection/transport layer, are disposed as necessary between the anode and the light-emitting layer. Likewise, one or more layers such as an electron injection layer, an electron transport layer, and an electron injection/transport layer are disposed as necessary between the cathode and the light-emitting layer.

These layers, as well as the light-emitting layer, are commonly referred to as functional layers.

In a full-color organic EL display panel, a plurality of such organic EL elements are disposed and form red sub-pixels, green sub-pixels, and blue sub-pixels. Further, each pixel of a full-color organic EL display panel is composed of a set of red, green, and blue sub-pixels disposed next to one another.

The manufacturing of such an organic EL display panel involves a process of forming one or more organic functional layers, including the light-emitting layer, in concave spaces defined by banks, after forming the banks on the substrate. The forming of the organic functional layers is often performed through a wet process of applying, to the concave spaces, ink containing a macro-molecular material or a low-molecular material suitable for forming a thin film, through an inkjet method or a similar method. Such a wet process enables organic functional layers to be formed relatively easily, even in large panels.

CITATION LIST

Patent Literature

Patent Literature 1

WO Publication No. 2010/013654

SUMMARY OF INVENTION

Technical Problem

In the manufacturing process of an organic EL display panel such as that described above, a defect portion may be produced by a portion of a bank collapsing, adhesion of a foreign particle to a bank, or the like. The presence of such a defect portion may cause inks of different colors, applied with respect to different sides of the bank having the defect portion in the process of forming light-emitting layers, to mix. This brings about color mixture.

An organic EL display panel manufactured using a panel in which such color mixture has occurred may emit, from the region where the color mixture has occurred, light with a color differing from an intended color, which results in display failure.

In view of this, there is a demand for a technology of repairing a bank having a defect portion to prevent the occurrence of display failure in a display panel.

In view of the above, the present invention aims to provide an organic EL display device manufacturing method and an organic EL display device that suppress the occurrence of display failure even if a bank defect portion is produced in the manufacturing process of the organic EL display device due to for example collapsing of a bank or a foreign particle.

Solution to Problem

In order to achieve the above-described aim, one aspect of the present invention is a method of manufacturing an organic electroluminescence (EL) display device by forming banks over a substrate and forming an organic functional layer in each of a plurality of concave spaces partitioned from one another by the banks, the method including: detecting a defect portion of a bank; when a bank defect portion is detected, forming, in each of adjacent concave spaces, among the plurality of concave spaces, between which one of the banks having the bank defect portion is located, one or more dams partitioning the concave space into a first space in a vicinity of the bank defect portion and a second portion not in the vicinity of the bank defect portion; and forming the organic functional layer in each of the plurality of concave spaces by causing a nozzle head to eject ink into the concave spaces, wherein in the forming of the organic functional layer, there is an ink dropping point where the nozzle head ejects the ink in each of the first space and the second space.

Advantageous Effects of Invention

When manufacturing an organic EL display device according to the method pertaining to one aspect of the present invention, color mixture occurring due to ink layers mixing via a defect portion occurs only within the first space, which is in the vicinity of the defect portion. As such, display failure in the organic EL display device that is manufactured is suppressed.

Further, in the forming of the organic functional layer, it is ensured that there is an ink dropping point of ink that is ejected from the nozzle head in both the first and second spaces. Accordingly, ink for forming the organic functional layer is applied to both the first and second spaces.

Accordingly, display failure in the organic EL display device that is manufactured is suppressed, and the organic EL display device that is manufactured has excellent display performance.

Each of FIG. 5A through FIG. 5E is a schematic cross-sectional view illustrating a part of the manufacturing process of the display panel.

Figure 6A:
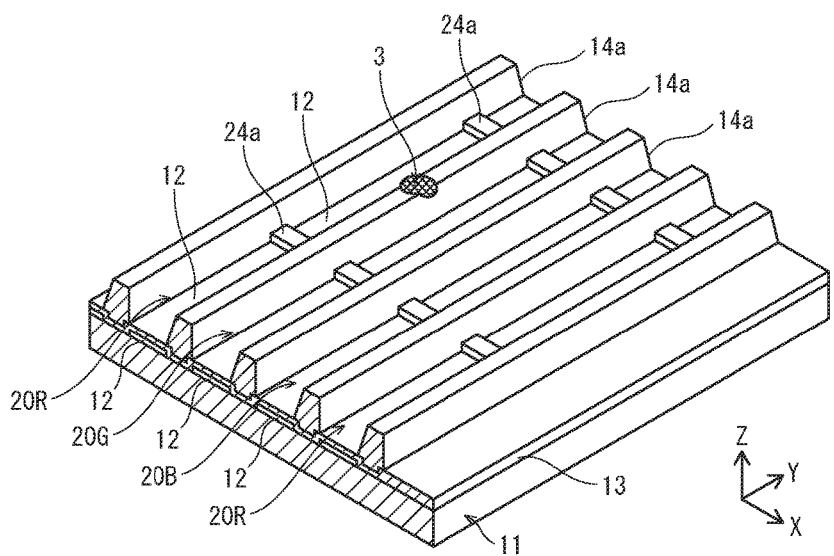
Figure 6B:
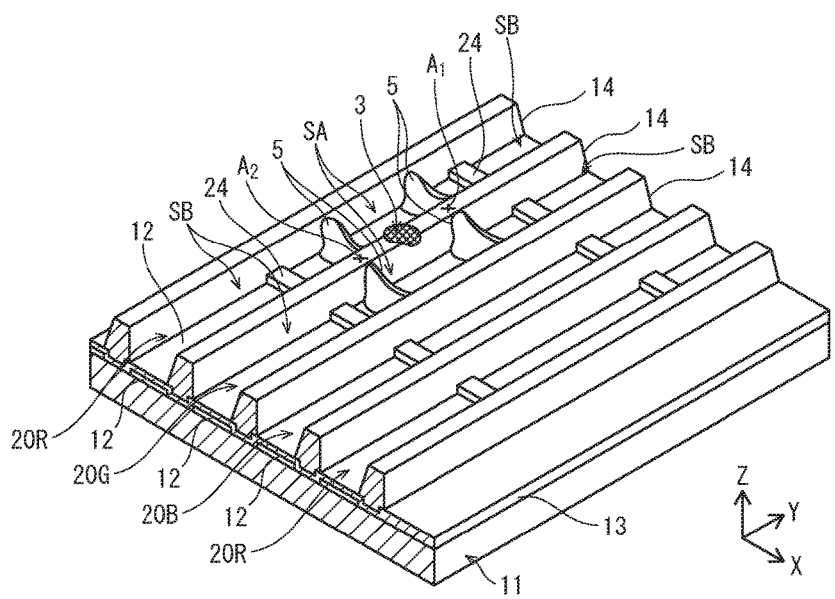

FIG. 6A is a perspective view illustrating an example of a defect portion, and FIG. 6B is a perspective view illustrating dams pertaining to embodiment 1 formed around the defect portion.

Figure 7A:
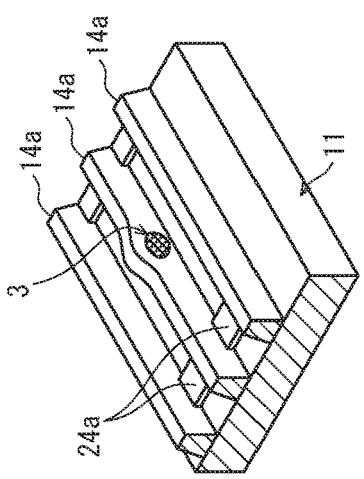
Figure 7B:
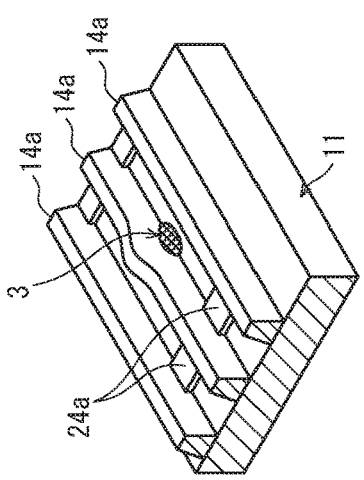
Figure 7C:
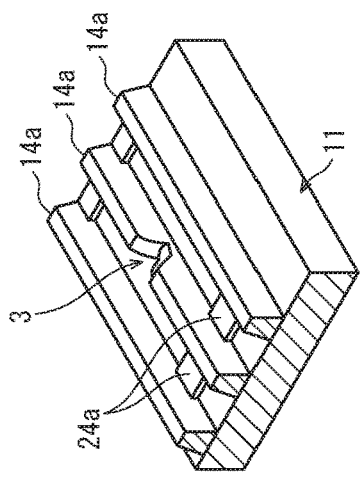

FIG. 7A is a schematic perspective view illustrating another example of a defect portion produced by a foreign particle, FIG. 7B is a schematic perspective view illustrating yet another example of a defect portion produced by a foreign particle, and FIG. 7C is a schematic perspective view illustrating one example of a defect portion produced by a bank collapsing.

Figure 8:
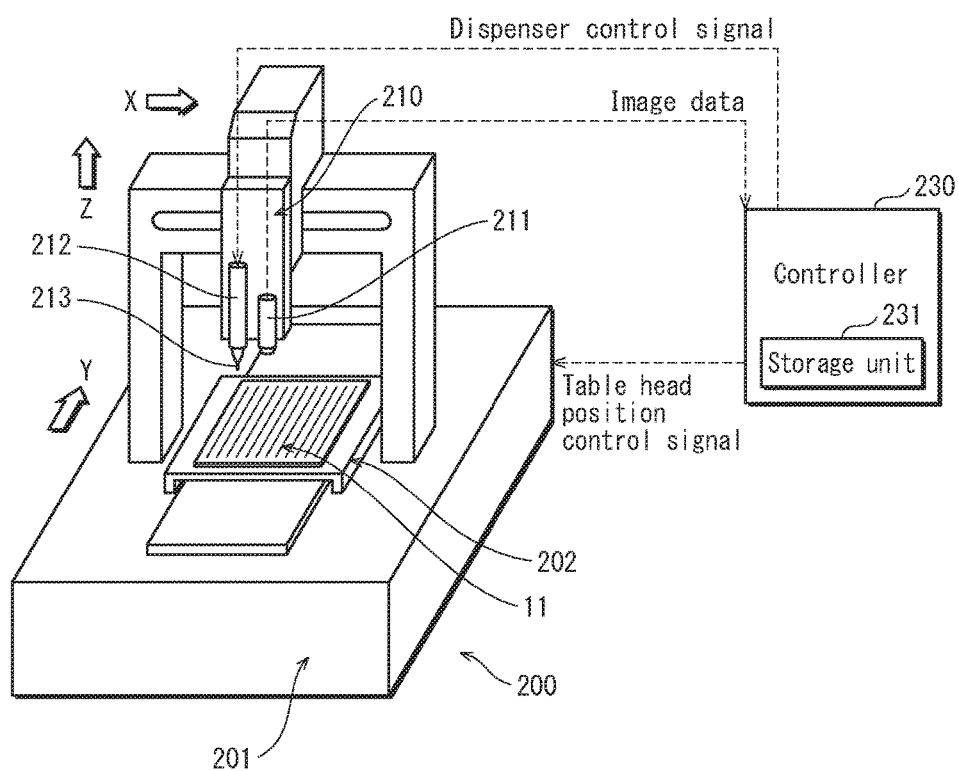

FIG. 8 is a schematic illustrating the structure of one example of a repair device used for detecting and repairing defect portions.

Figure 9:
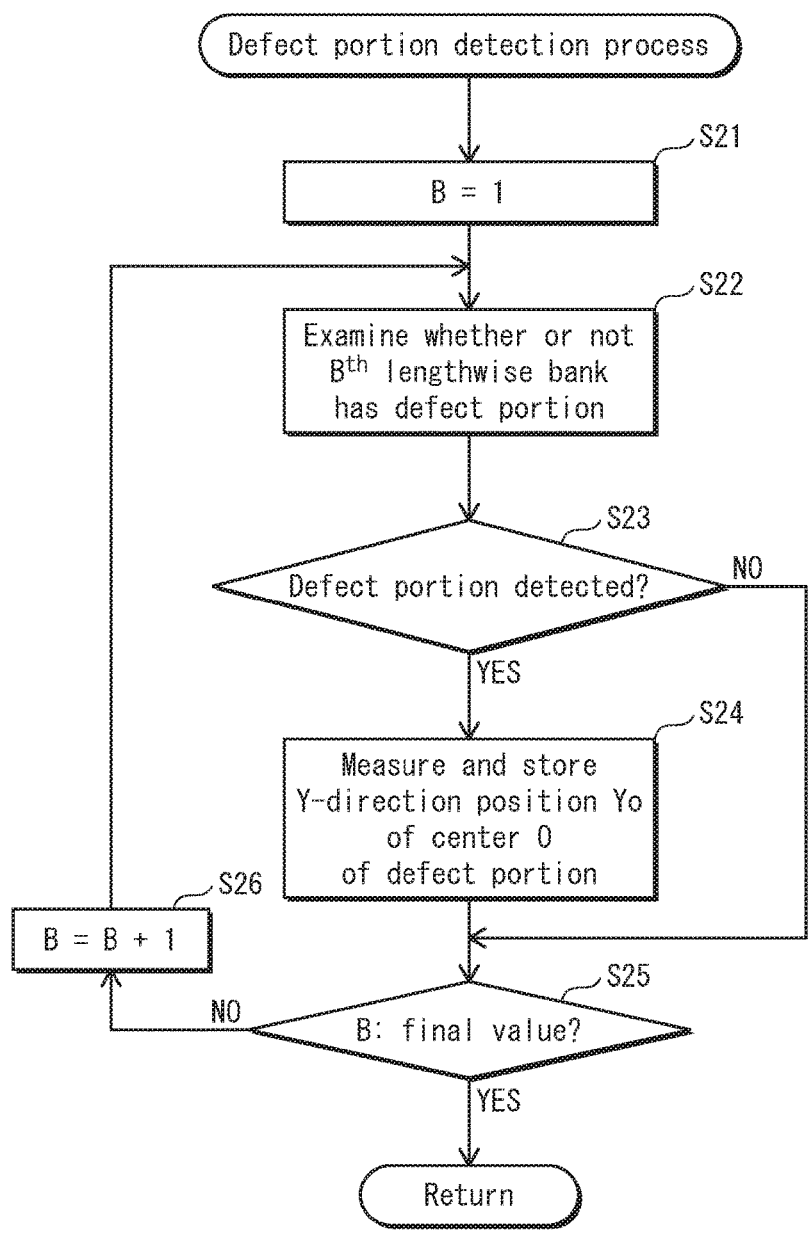

FIG. 9 is a flowchart illustrating one example of operations of the repair device for detecting defect portions.

Figure 10:
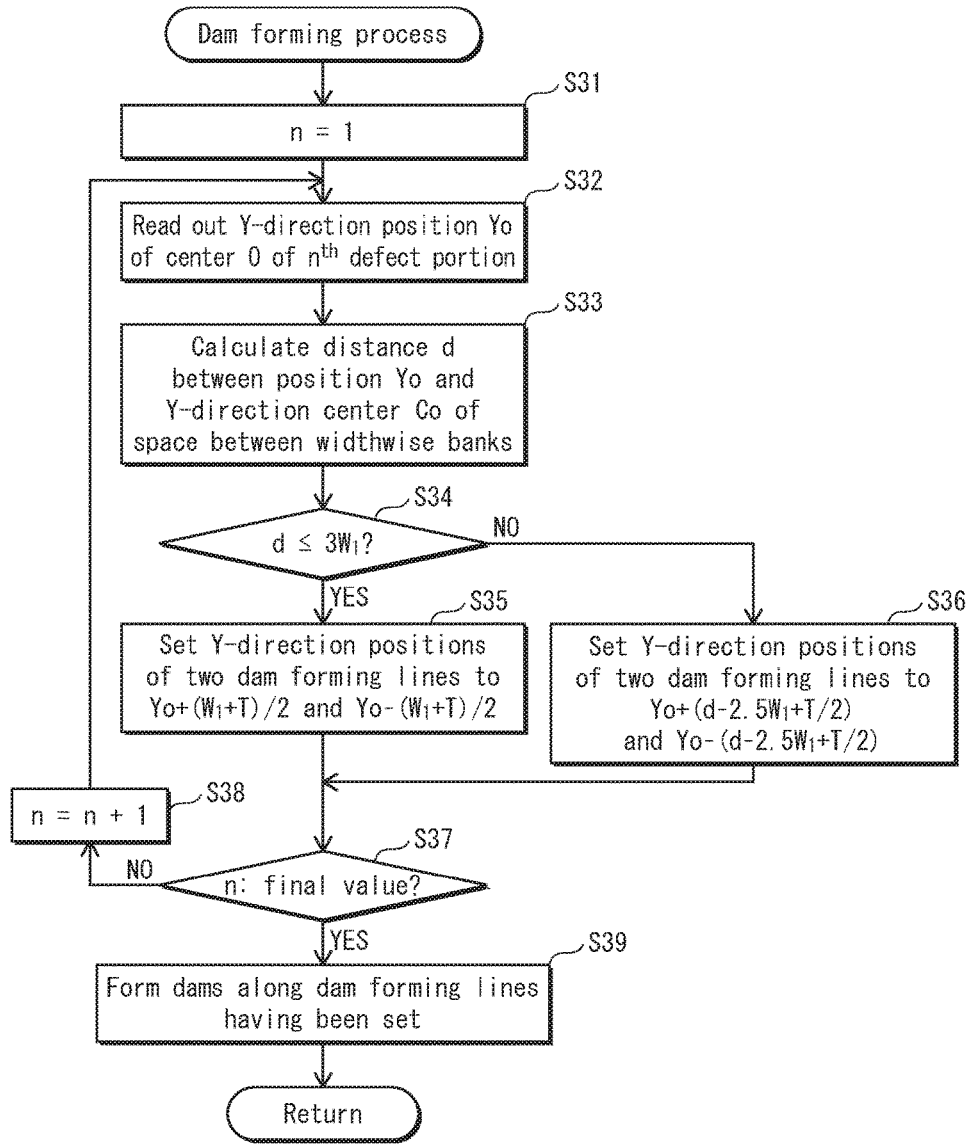

FIG. 10 is a flowchart illustrating one example of operations of a dam forming process performed by the repair device.

Figure 11A:
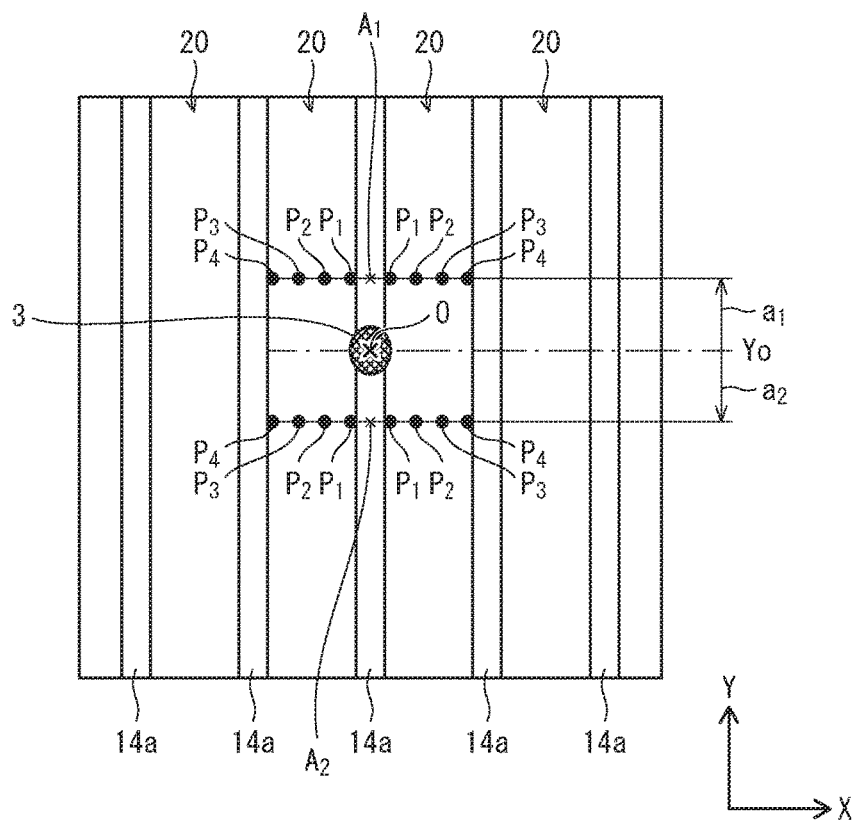
Figure 11B:
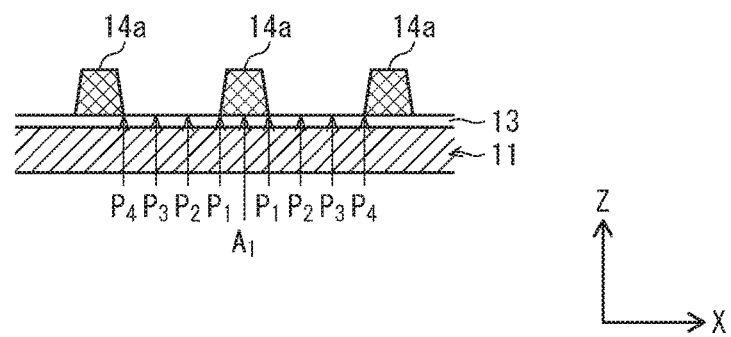

FIG. 11A illustrates application positions of a repair material, set in an image including a defect portion, and FIG. 11B is a schematic cross-sectional view along a dam forming line passing through point $A_1$.

Figure 12A:
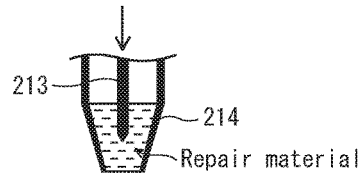
Figure 12B:
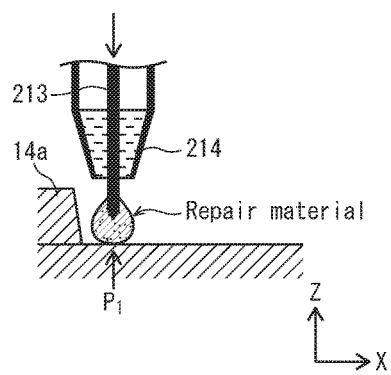
Figure 12C:
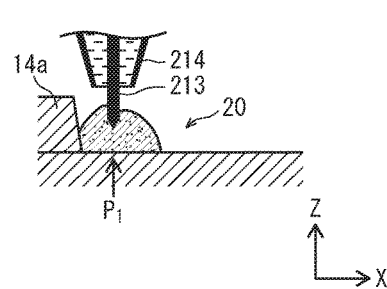
Figure 12D:
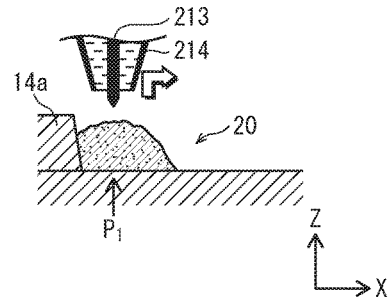
Figure 12E:
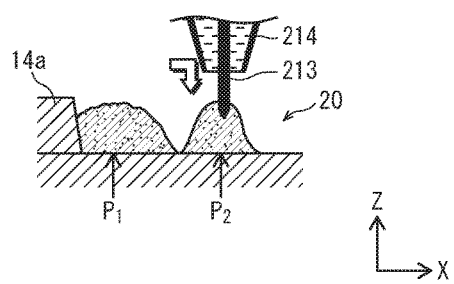
Figure 12F:
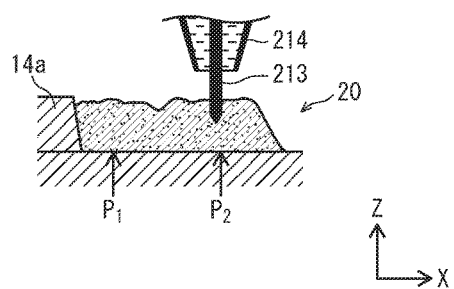
Figure 12G:
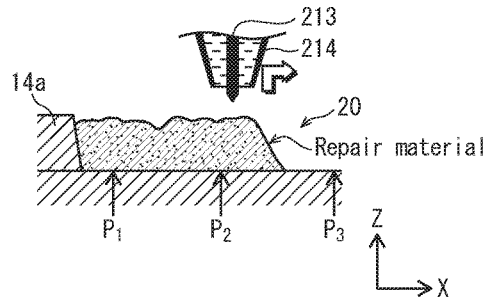

FIG. 12A through FIG. 12G are schematic cross-sectional views illustrating how a dam is formed through application of the repair material, with FIG. 12A illustrating a state of a tank and a needle before the application of the repair material, FIG. 12B illustrating a state where the repair material adhering to a needle has been applied to application point $P_1$, FIG. 12C illustrating a state where the needle is being moved upward, FIG. 12D illustrating a state where the needle has been moved upward, FIG. 12E illustrating a state where the repair material has been applied to application point $P_2$ after moving the needle and the tank, FIG. 12F illustrating a state where the repair material having been applied to application point $P_1$ and the repair material having been applied to application point $P_2$ have connected, and FIG. 12G illustrating a state where the needle has been moved upward.

Figure 13:
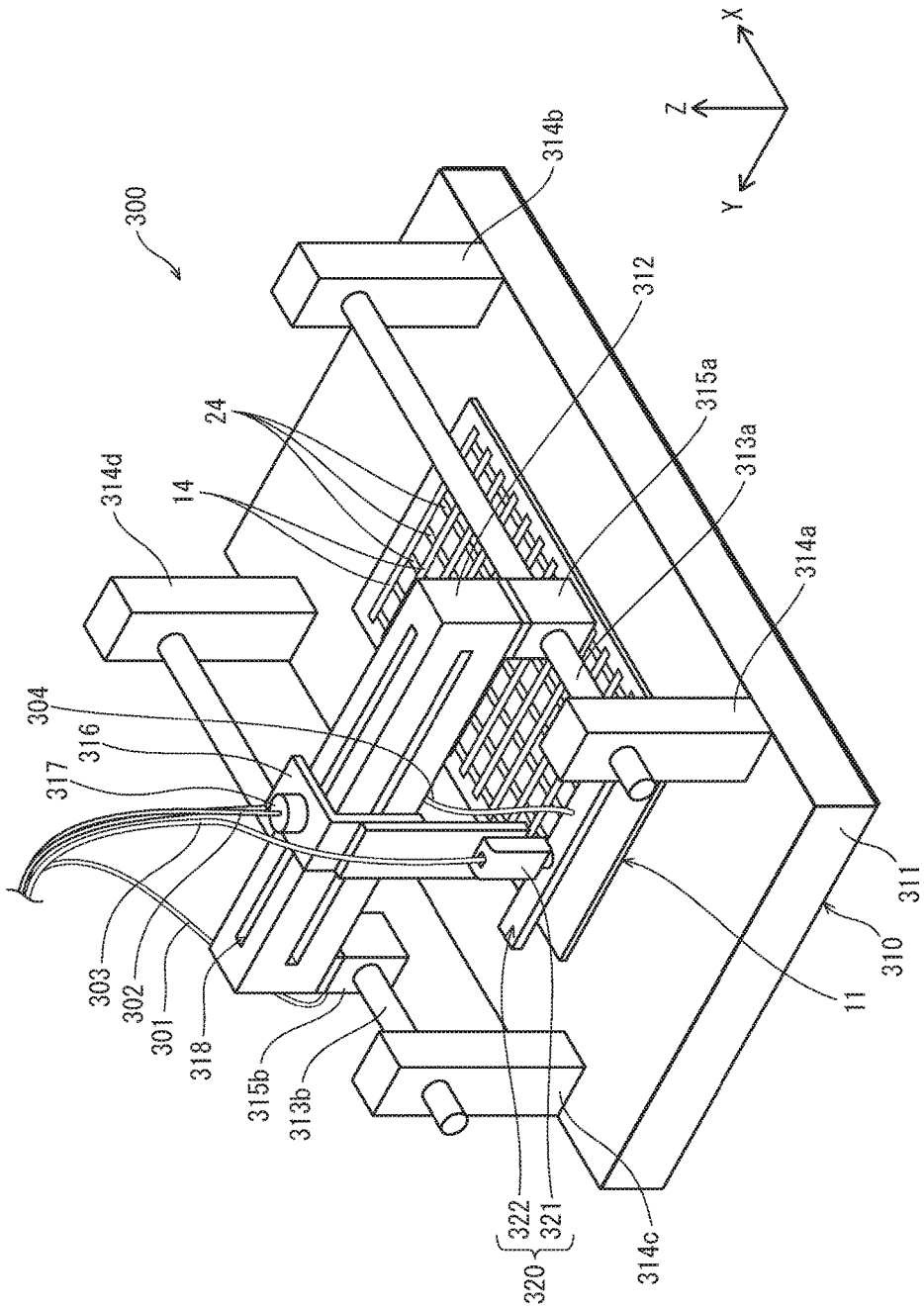

FIG. 13 illustrates the structure of an inkjet device used in the light-emitting layer forming process.

Figure 14:
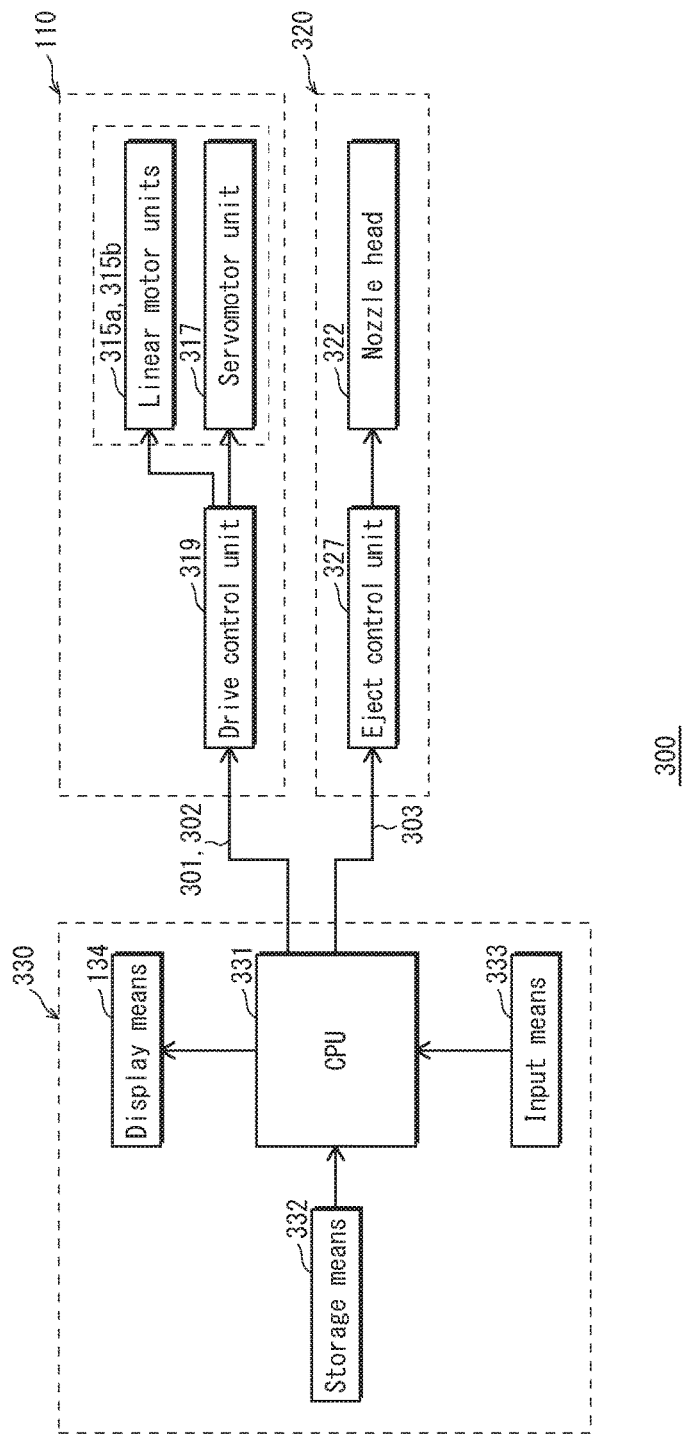

FIG. 14 is a functional block diagram of the inkjet device.

Figure 15A:
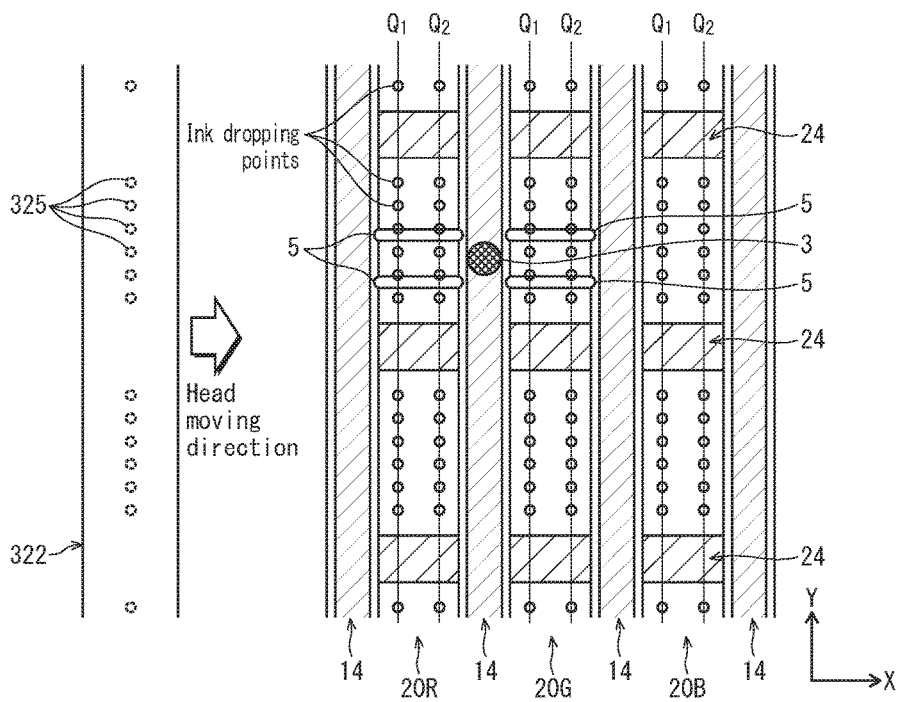
Figure 15B:
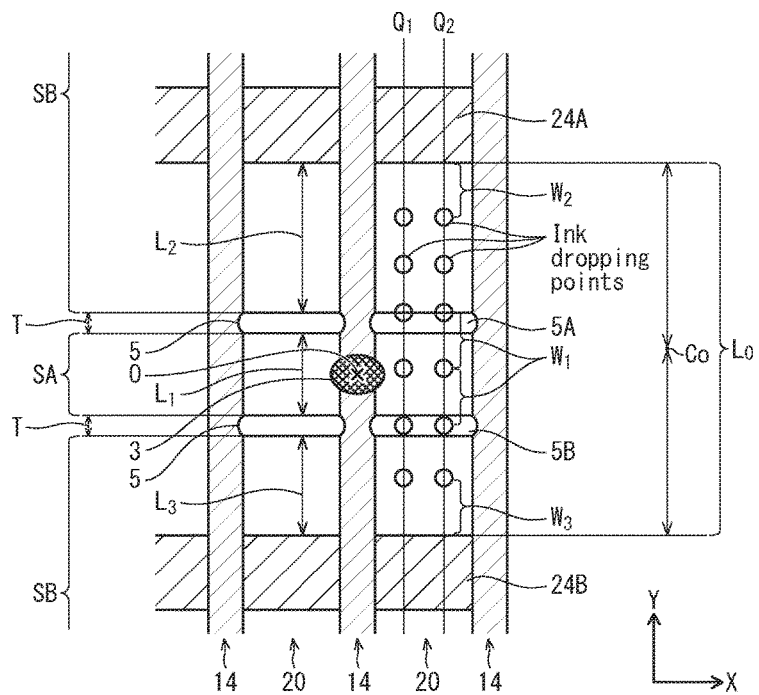

FIG. 15A is a schematic plan view illustrating how ink is dropped into a concave space near a defect portion in the light-emitting layer forming process, and FIG. 15B is a schematic plan view illustrating a part of FIG. 15A in enlarged state.

FIG. 16A and FIG. 16B illustrate the effects achieved by forming the dams pertaining to embodiment 1, with FIG. 16A being a schematic plan view illustrating a state where the dams have been formed and FIG. 16B being a schematic plan view illustrating a comparative example where dams are not formed.

Figure 17:
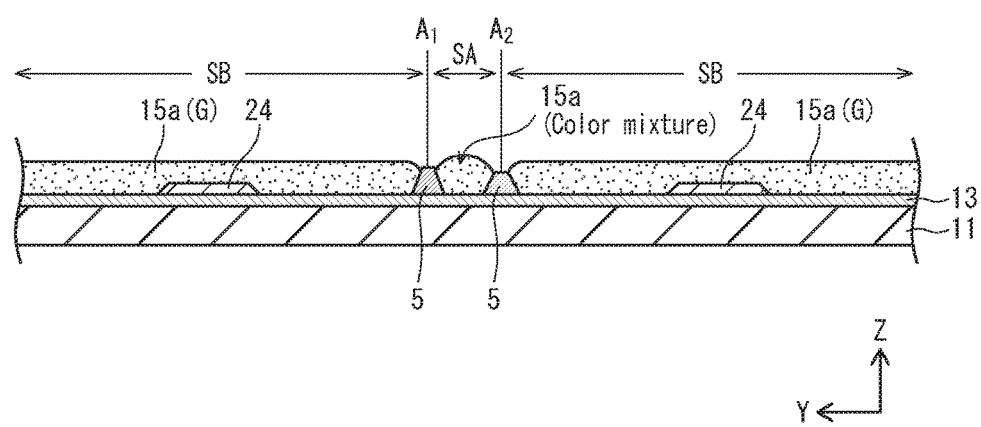

FIG. 17 is a cross-sectional view taken along line C-C in FIG. 16A.

Figure 18A:
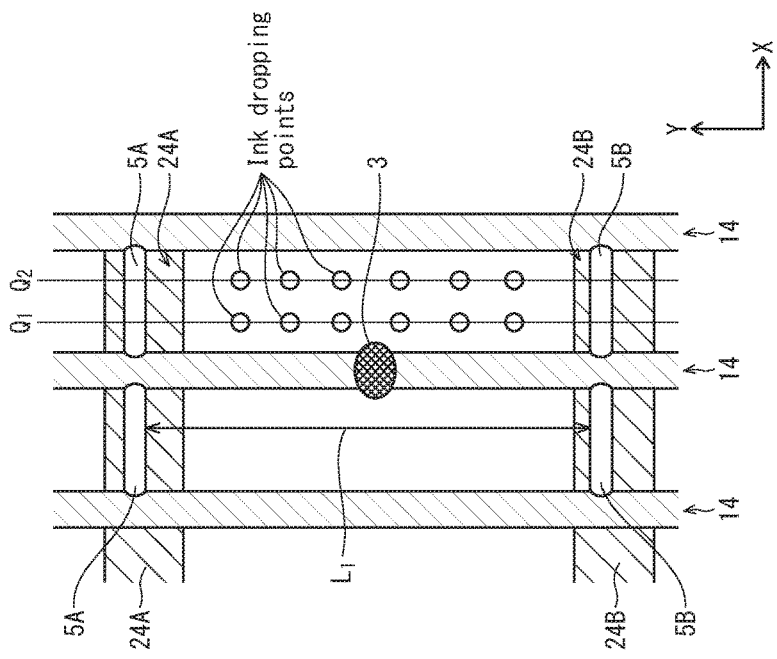
Figure 18B:
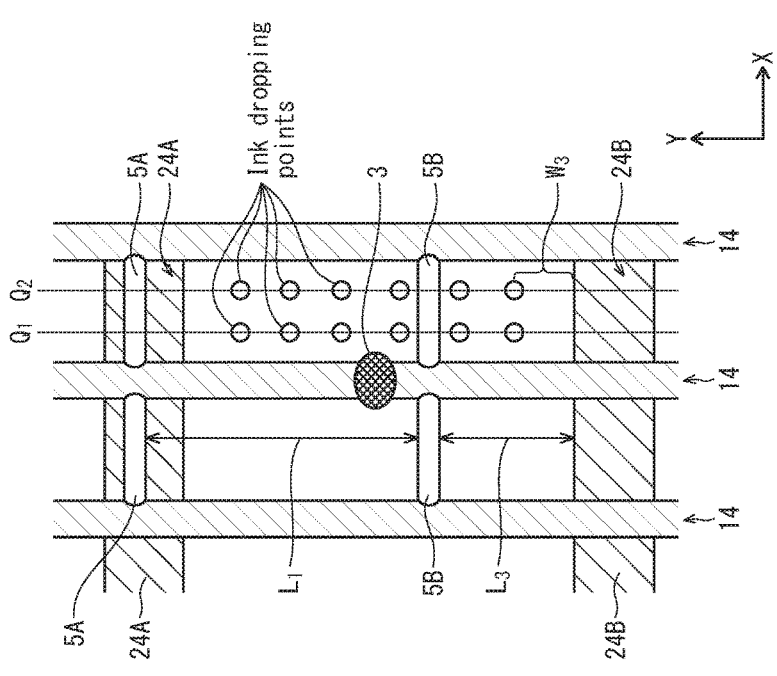

FIG. 18A is a schematic plan view illustrating a shape of dams pertaining to a modification of embodiment 1 where some dams are formed on widthwise banks, and FIG. 18B is a schematic plan view illustrating a shape of dams pertaining to a another modification of embodiment 1 where all dams are formed on widthwise banks.

Figure 19A:
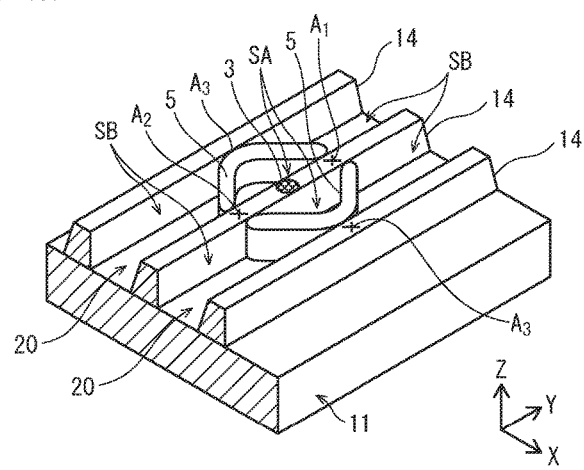
Figure 19B:
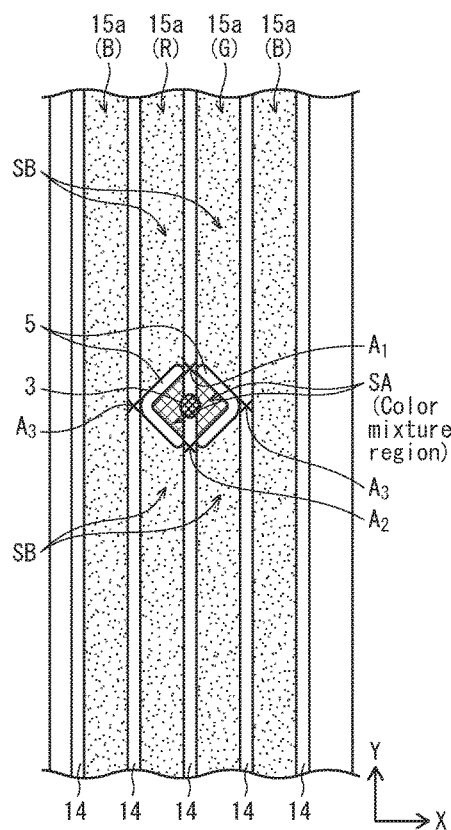
Figure 19C:
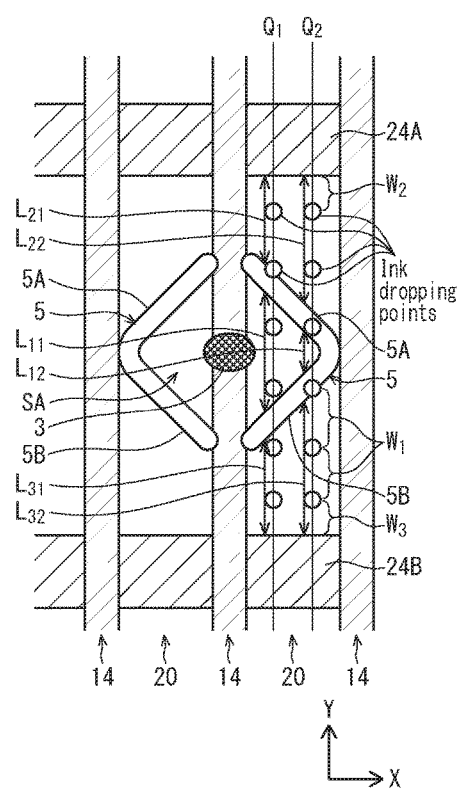

FIG. 19A is a perspective view illustrating a shape of dams pertaining to embodiment 2, FIG. 19B is a schematic plan view illustrating a state where ink layers have been formed after forming dams in concave spaces, and FIG. 19C is a schematic plan view illustrating ink dropping points with respect to a concave space in which a dam has been formed.

Figure 20A:
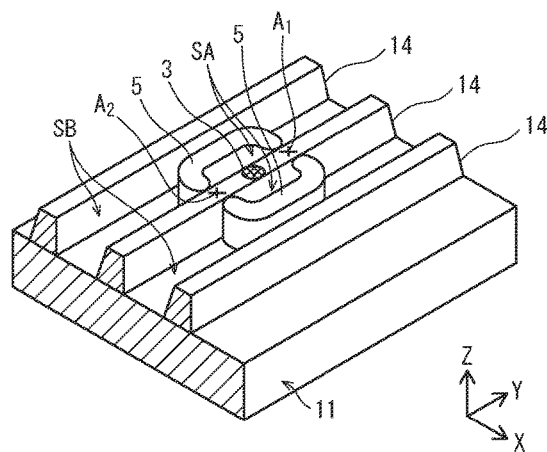
Figure 20B:
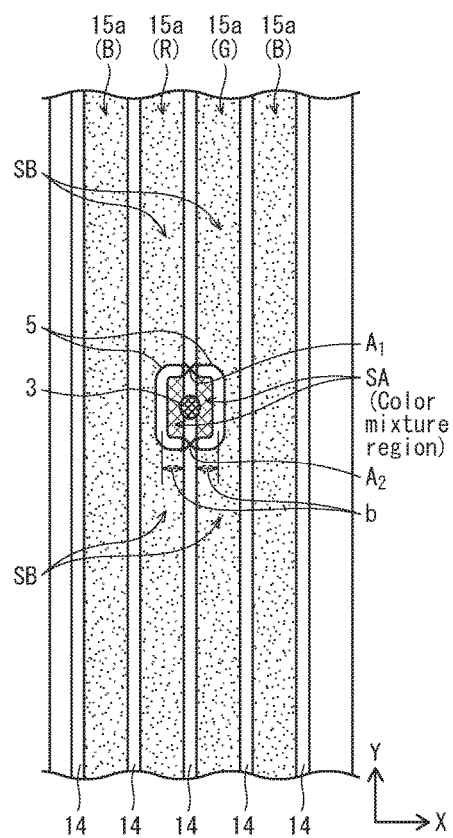
Figure 20C:
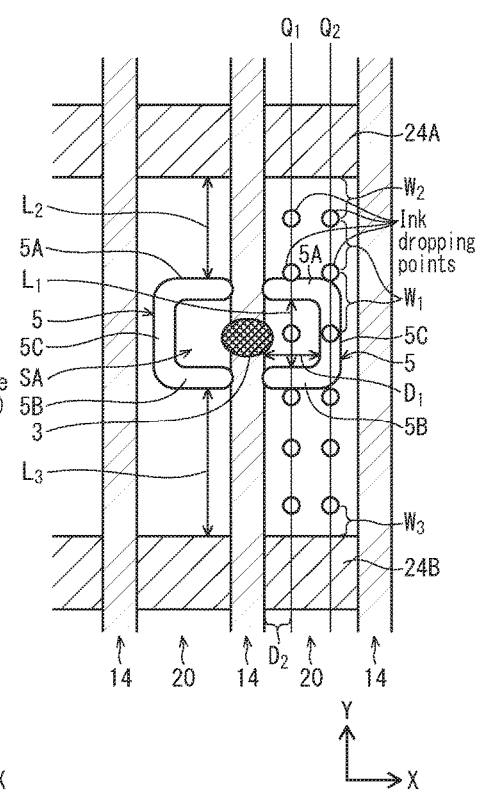

FIG. 20A is a perspective view illustrating a shape of dams pertaining to embodiment 3, FIG. 20B is a schematic plan view illustrating a state where ink layers have been formed after forming dams in concave spaces, and FIG. 20C is a schematic plan view illustrating ink dropping points with respect to a concave space in which a dam 5 has been formed.

Figure 21A:
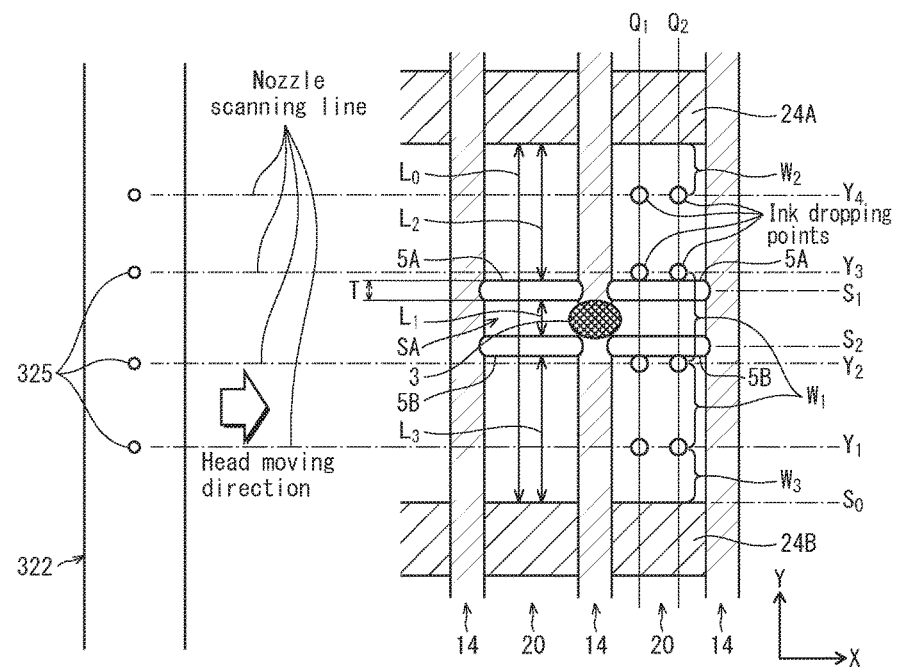
Figure 21B:
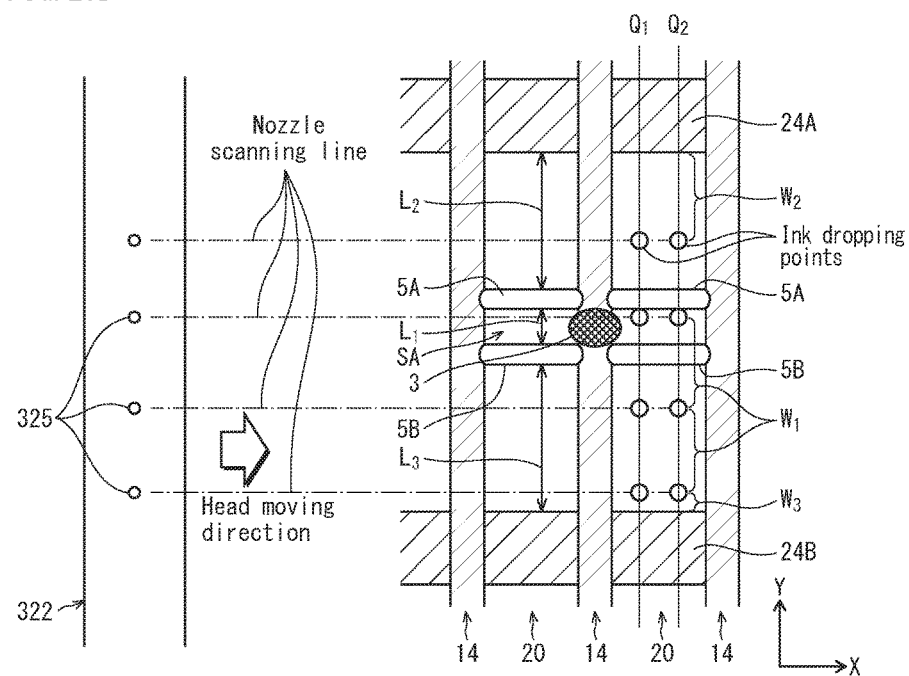

FIG. 21A and FIG. 21B are schematic plan views illustrating how a position of a nozzle head is adjusted for ink application in embodiment 4 after forming dams in concave spaces, with FIG. 21A being a schematic plan view illustrating a case where a Y-direction position of the nozzle head is set to a standard position, and FIG. 21B being a schematic plan view illustrating a state after adjustment of the Y-direction position of the nozzle head.

FIG. 22 is a flowchart illustrating one specific example of a process of applying ink with the inkjet device.

Figure 23A:
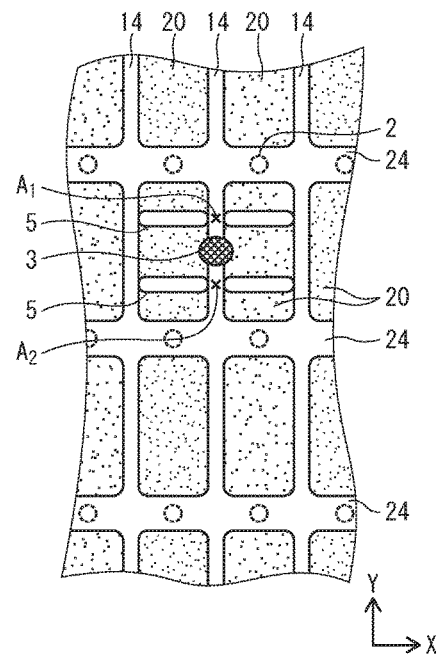
Figure 23B:
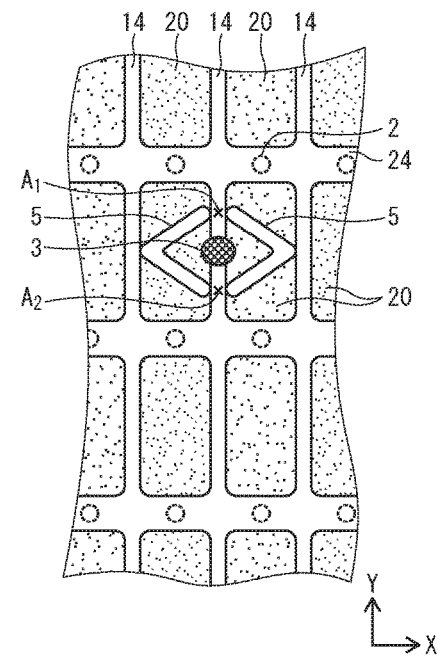
Figure 23C:
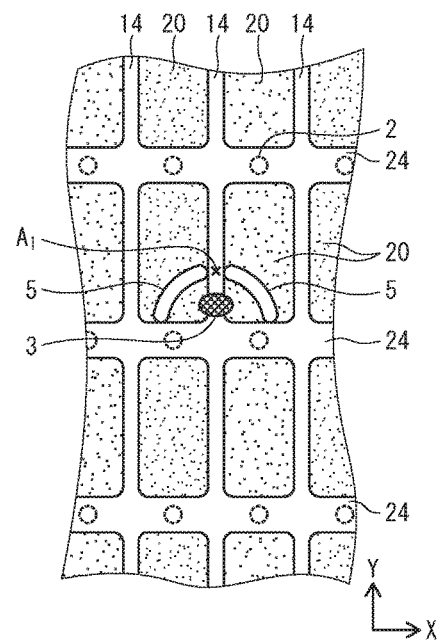
Figure 23D:
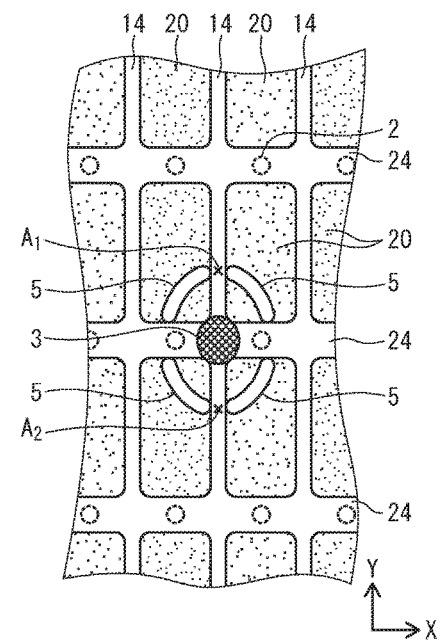

FIG. 23A through FIG. 23D are schematic plan views illustrating modifications applicable in repairing, by using dams, a defect portion in a pixel bank structure of a display panel, with FIG. 23A illustrating a modification where dams having the same shape as those in embodiment 1 are formed, FIG. 23B illustrating a modification where dams having the same shape as those in embodiment 2 are formed, FIG. 23C illustrating a modification applicable when the defect portion is located near a widthwise bank, and FIG. 23D illustrating a modification applicable when the defect portion is located where a lengthwise bank and a widthwise bank intersect.

DESCRIPTION OF EMBODIMENTS

<Conception of Present Invention>

In the field of manufacturing technology for flat display substrates, Patent Literature 1 for example discloses repairing a portion of a bank having collapsed by removing a portion of the bank around the portion having collapsed, and applying, before ink application, a bank repair liquid containing an ink-repellent polymer to the removed portion of the bank.

When a portion of a bank has collapsed, it can be expected that the mixing of different inks can be prevented by repairing the collapsed portion according to such technology before performing ink application.

However, a bank may have a defect portion produced by a foreign particle adhering to the bank, rather than a defect portion produced by collapsing of a bank. With a defect portion produced by a foreign particle having adhered to a bank, it may be difficult to repair the defect portion according to the above-described conventional technology of applying polymer material. For example, the foreign particle may repel the polymer liquid applied for repairing the defect portion, which may result in the defect portion not being repaired properly.

In addition, according to observations by the inventor, due to organic EL display devices nowadays having very narrow banks with widths of 10 µm or smaller and it being expected that bank width will become even smaller in the future as pixel definition increases, repairing a portion of a bank having collapsed through accurate positioning of an application needle is technically difficult.

In consideration of the above, the inventor considered a method that enables repairing defect portions in high-definition EL display devices in particular with ease and that suppresses the occurrence of display failure.

In the process, the inventor found that a spread of a region where different inks mix can be suppressed and thus the problem of light-emitting color failure (display failure) can be overcome without repairing the bank defect portions themselves but by forming dams in concave spaces around the defect portion.

Meanwhile, in an organic EL display device, an organic light-emitting layer (one example of an organic functional layer) is disposed between a pair of electrodes, and emits light when voltage is applied between the electrodes. Further, a dam formed in a concave space as described above partitions the concave space into a first space and a second space. Here, when a functional layer is not formed in the first space (i.e., when a situation commonly referred to as ink-unwetting occurs in the first space), for example, light-emission failure may occur at a corresponding part of an organic EL display device that is manufactured.

Accordingly, the inventor arrived at the present invention by also considering the need to prevent light-emission failure occurring due to such ink-unwetting.

<Aspects of Invention>

One aspect of the present invention is a method of manufacturing an organic electroluminescence (EL) display device by forming banks over a substrate and forming an organic functional layer in each of a plurality of concave spaces partitioned from one another by the banks, the method including: detecting a defect portion of a bank; when a bank defect portion is detected, forming, in each of adjacent concave spaces, among the plurality of concave spaces, between which one of the banks having the bank defect portion is located, one or more dams partitioning the concave space into a first space in a vicinity of the bank defect portion and a second portion not in the vicinity of the bank defect portion; and then forming the organic functional layer in each of the plurality of concave spaces by causing a nozzle head to eject ink into the concave spaces, wherein in the forming of the organic functional layer, there is an ink dropping point where the nozzle head ejects the ink in each of the first space and the second space.

According to this method, the one or more dams formed in a concave space partition an ink layer formed in the concave space by applying ink for forming an organic functional layer in each concave space. Thus, the region in which ink mixture occurs does not spread into the second space outside the vicinity of the defect portion. As such, display failure in the organic EL display device can be suppressed.

Further, according to this method, bank repair is performed by forming dams around the bank defect portion. Thus, bank repair can be performed relatively easily even if the bank detect portion is produced by a foreign particle.

Further, according to this method, ink for forming the organic functional layer is applied to both the first space and the second space. Accordingly, display failure occurring due to unwetting with ink for forming the organic functional layer is suppressed in the organic EL display device that is manufactured, and the organic EL display device that is manufactured has excellent display performance.

Note that the dams, formed in the vicinity of the defect portion, differ from the banks and are formed separately from the banks, which are formed over the entire display area of the organic EL display device. This means that even if the organic EL display device includes both lengthwise banks and widthwise banks intersecting the lengthwise banks, the widthwise banks do not correspond to the dams, which are formed separately from the widthwise banks.

Further, while lengthwise banks and widthwise banks are typically formed at boundary positions between pixels (or sub-pixels) to partition pixels (or sub-pixels) from one another, the dams may be formed inside pixels (or inside sub-pixels).

The following modifications may be made to the method pertaining to one aspect of the present invention.

The method pertaining to one aspect of the present invention may further include forming lengthwise banks extending in parallel in one direction along a surface of the substrate, the lengthwise banks partitioning the plurality of concave spaces from one another, and in the forming of the organic functional layer, when there are a plurality of ink dropping points along each of one or more ink dropping lines extending in the one direction, in each of the plurality of concave spaces, the one or more dams may be provided with a shape such that, in a concave space in which the one or more dams are formed, a length of at least one of the ink dropping lines in the first space is greater than a pitch of ink dropping points along the ink dropping line.

According to this, in the forming of the organic functional layer, it is ensured that there is an ink dropping point in the first space.

The method pertaining to one aspect of the present invention may further include forming elongated widthwise banks extending in parallel along a surface of the substrate; and forming lengthwise banks extending in parallel in one direction along the surface of the substrate, the lengthwise banks intersecting the widthwise banks and having greater height than the widthwise banks, and when in the forming of the one or more dams, one dam is formed with there being a space between the one dam and a widthwise bank adjacent to the one dam, in the forming of the organic functional layer, it is preferable that there is an ink dropping point in the space between the one dam and the adjacent widthwise bank.

In doing so, when the lengthwise banks partition the plurality of concave spaces from one another, and in the forming of the organic functional layer, there are a plurality of ink dropping points along each of one or more ink dropping lines extending in the one direction, in each of the plurality of concave spaces, it suffices to make a configuration so that, in a concave space in which the one dam is formed, a length of at least one of the ink dropping lines in the space between the one dam and the adjacent widthwise bank is greater than a distance between the adjacent widthwise bank and an ink dropping point nearest the adjacent widthwise bank.

The method pertaining to one aspect of the present invention may further include forming lengthwise banks extending in parallel in one direction along a surface of the substrate, the lengthwise banks partitioning the plurality of concave spaces from one another, and in each of the adjacent concave spaces between which one of the lengthwise banks having the bank defect portion is located, two dams may be formed, the two dams extending from different ones of two points on the lengthwise bank having the bank defect portion to a lengthwise bank adjacent to the lengthwise bank having the bank defect portion, the two points being at different sides of the bank defect portion in the one direction.

In this case, in the forming of the organic functional layer, when there are a plurality of ink dropping points along each of one or more ink dropping lines extending in the one direction, in each of the plurality of concave spaces, the ink dropping lines intersecting with the two dams, it suffices to make a configuration so that along at least one of the ink dropping lines, a distance between the two dams is greater than a pitch of ink dropping points. According to this, in the forming of the organic functional layer, it is ensured that there is an ink dropping point in the first space.

The method pertaining to one aspect of the present invention may further include forming lengthwise banks extending in parallel in one direction along a surface of the substrate, the lengthwise banks partitioning the plurality of concave spaces from one another, and in each of the adjacent concave spaces between which one of the lengthwise banks having the bank defect portion is located, one dam may be formed, the one dam extending from one to the other of two points on the lengthwise bank having the bank defect portion while detouring around the bank defect portion, the two points being at different sides of the bank defect portion in the one direction.

In this case, in the forming of the organic functional layer, when there are a plurality of ink dropping points along each of one or more ink dropping lines extending in the one direction, in each of the plurality of concave spaces, it suffices to make a configuration so that along at least one of the ink dropping lines that intersects the one dam at two positions of the one dam, a distance between the two positions of the one dam is greater than a pitch of ink dropping points. According to this, in the forming of the organic functional layer, it is ensured that there is an ink dropping point in the first space.

In the method pertaining to one aspect of the present invention, the one dam may come in contact with a lengthwise bank adjacent to the lengthwise bank having the bank defect portion at some point along a path between the two points, or may not come in contact with a lengthwise bank adjacent to the lengthwise bank having the bank defect portion.

When the one dam does not come in contact with a lengthwise bank adjacent to the lengthwise bank having the bank defect portion, a configuration is made so that in a concave space in which the one dam is formed, a distance between the at least one of the ink dropping lines and the lengthwise bank having the bank defect portion is smaller than a separation distance that is a distance from the lengthwise bank having the bank defect portion to a portion of the one dam that is farthest from the lengthwise bank having the bank defect portion.

The method pertaining to one aspect of the present invention may further include forming lengthwise banks extending in parallel in one direction along the surface of the substrate, the lengthwise banks partitioning the plurality of concave spaces from one another, and when forming, in each of the plurality of concave spaces, widthwise banks having smaller height than the lengthwise banks, the forming of the one or more dams may be performed so that one or more dams are formed on the widthwise banks.

According to this, since a widthwise bank exists near a bottom portion of a dam, the risk of current leakage occurring near a bottom portion of a dam in the organic EL display device that is manufactured is low even if ink unwetting occurs near the bottom portion of the dam.

In the method pertaining to one aspect of the present invention, in the forming of the organic functional layer: the ink may be applied to each of the plurality of concave spaces by moving the nozzle head along the substrate while causing the nozzle head to eject the ink; and the presence of an ink dropping point in each of the first space and the second space may be ensured by adjusting a position of the nozzle head in a direction along the substrate that is perpendicular to the direction in which the nozzle head is moved.

Further, while the organic functional layer is basically an organic light-emitting layer, there are other examples of organic functional layers, such as a hole injection layer, a hole transport layer, an electron transport layer, and an electron injection layer.

One aspect of the present invention is an organic EL display device including: a substrate; banks over the substrate, the banks partitioning a plurality of concave spaces from one another; an organic functional layer in each of the concave spaces; and in each of adjacent concave spaces, among the plurality of concave spaces, between which a bank having a bank defect portion is located, one or more dams partitioning the organic functional layer in the concave space into a first organic functional layer in a vicinity of the bank defect portion and a second organic functional layer not in the vicinity of the bank defect portion.

According to this organic EL display device, the one or more dams formed in a concave space partition the ink layer formed in the concave space by applying ink for forming an organic functional layer in each concave space into the first organic functional layer in the vicinity of the bank defect portion and the second organic functional layer not in the vicinity of the bank defect portion. Thus, the region of ink mixture in the organic functional layer is constrained within the first organic functional layer, and does not spread into the second organic functional layer.

Further, due to the first organic functional layer and the second organic functional layer being formed in a concave space at different sides of the one or more dams partitioning the concave space, display failure occurring due to ink unwetting is suppressed in this organic EL display device, and the organic EL display device has excellent display performance.

Embodiment 1

[Overall Structure of Organic EL Display Device]

Figure 1:
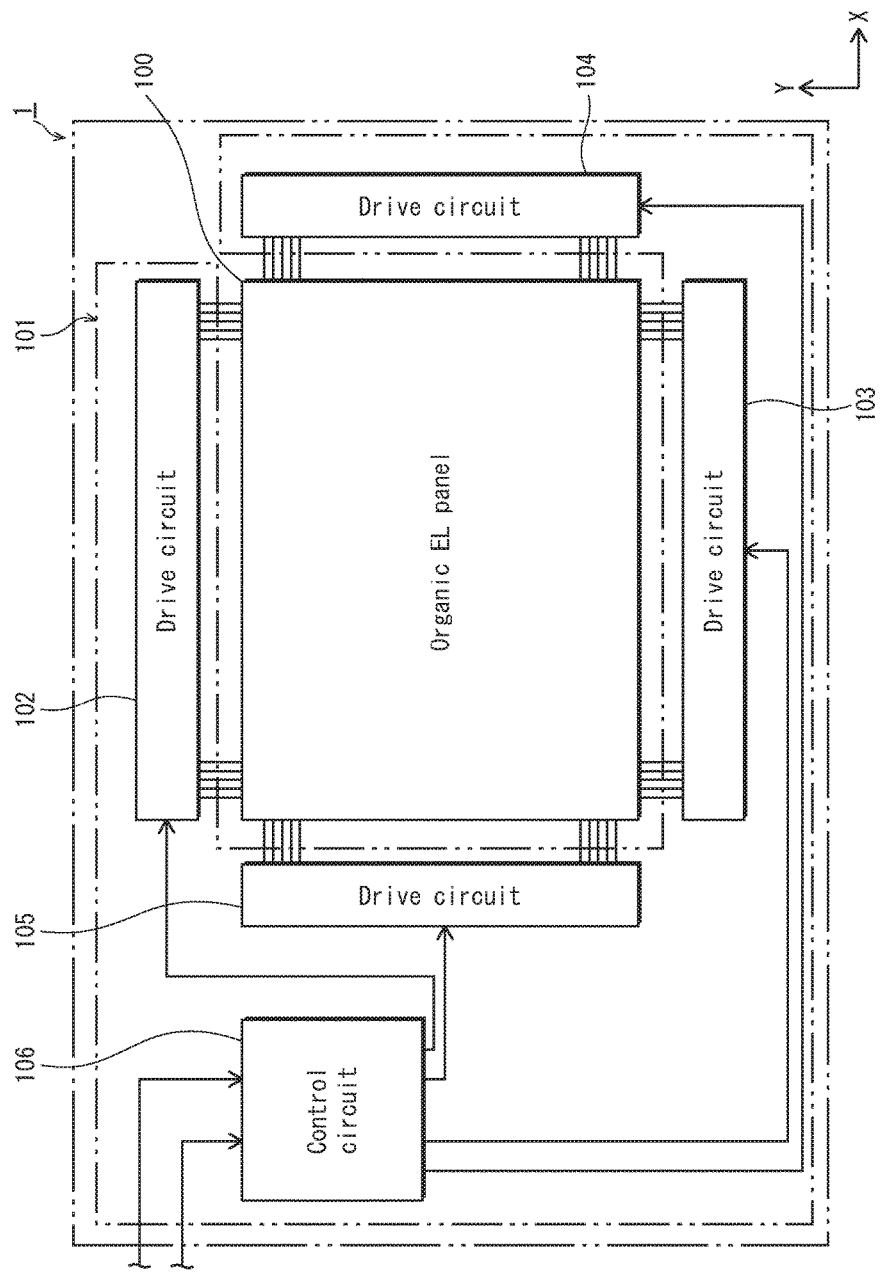
FIG. 1 is a schematic block diagram illustrating the structure of an organic EL display device.

FIG. 1 is a schematic block diagram illustrating the structure of an organic EL display device 1 having a display panel 100 pertaining to embodiment 1.

Figure 2:
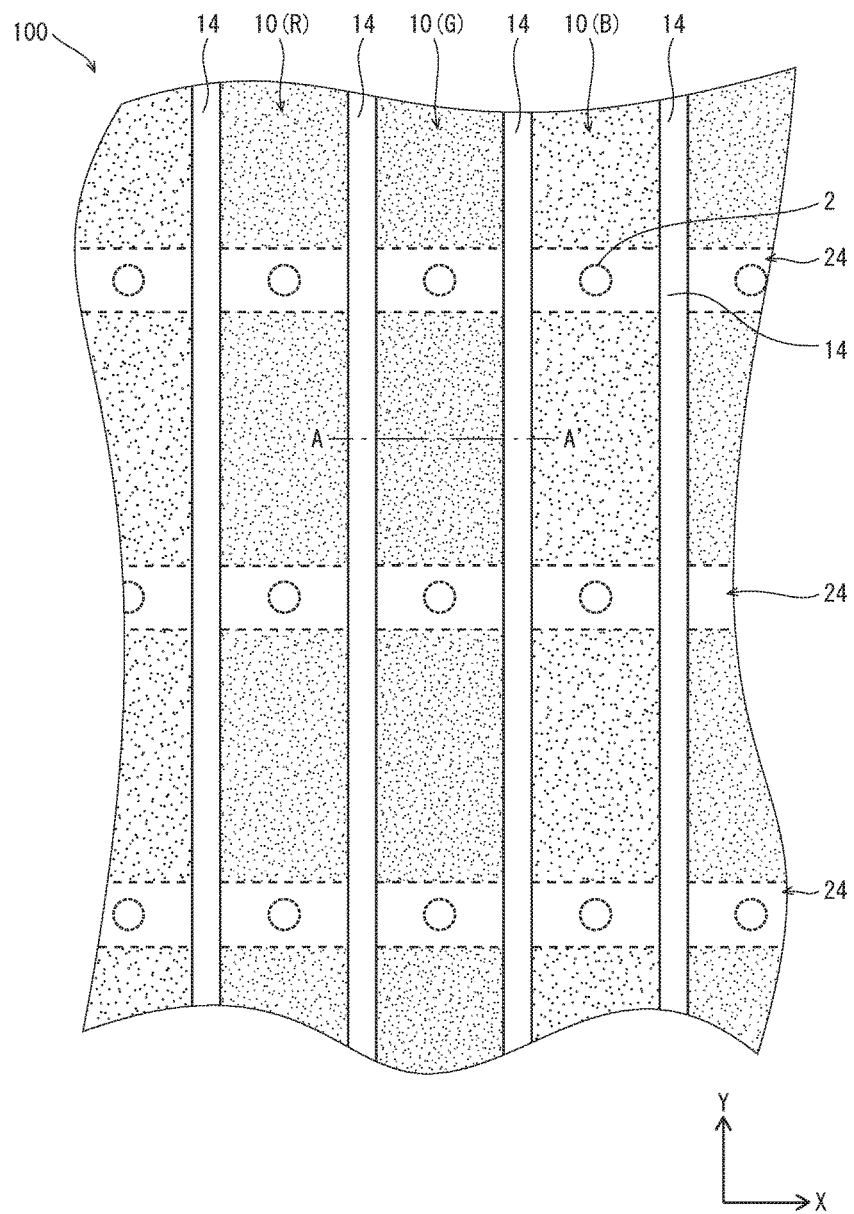
FIG. 2 is a plan view of a part of a display panel.

As illustrated in FIG. 1, the organic EL display device 1 includes the display panel 100 and a drive controller 101 connected thereto. The display panel 100 is a panel using the electroluminescence effect of an organic material. In the display panel 100, light-emitting elements (organic EL elements) 10 are arranged over a substrate to form a matrix, as illustrated in FIG. 2. The drive controller 101 includes four drive circuits, namely drive circuits 102, 103, 104, and 105, and a control circuit 106.

For example, the arrangement of the drive controller 101 with respect to the display panel 100 is not limited to that illustrated in FIG. 1.

[Structure of Organic EL Display Panel]

Figure 3:
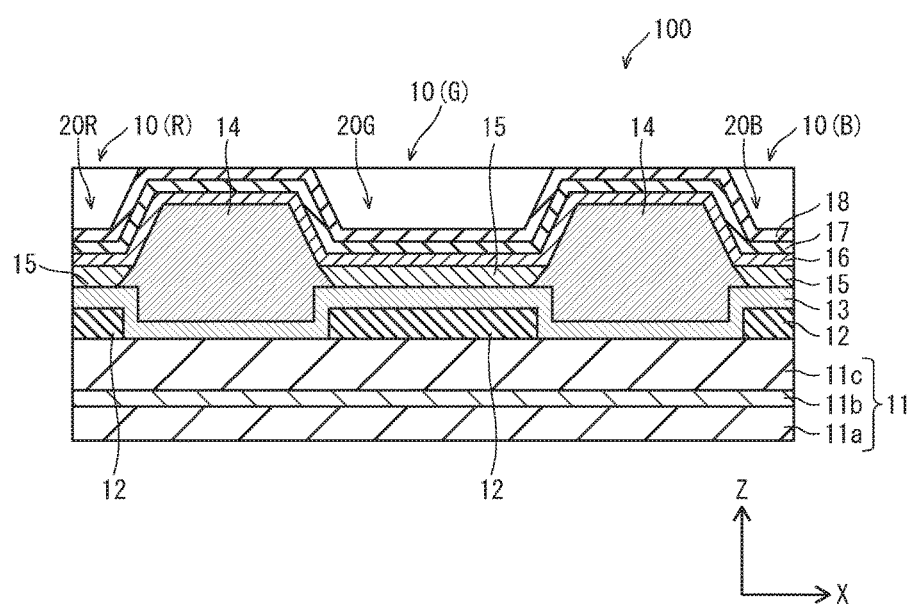
FIG. 3 is a cross-sectional view taken along line A-A' of FIG. 2, illustrating a part of the display panel in enlarged state.

FIG. 2 schematically illustrates the overall structure of the display panel 100, when viewed in plan view from above a display surface thereof. FIG. 3 is a cross-sectional view taken along line A-A' of FIG. 2, illustrating a part of the display panel 100 in enlarged state. The display panel 100 is a top-emission-type panel, and the display surface of the display panel 100 is located in the Z direction in FIG. 3.

The following describes the structure of the display panel 100, with reference to FIG. 2 and FIG. 3.

As illustrated in FIG. 3, the display panel 100 includes, as main components thereof, a ground substrate 11, pixel electrodes 12, a hole injection layer 13, lengthwise banks 14, organic light-emitting layers 15, an electron transport layer 16, a common electrode 17, and a sealing layer 18.

The hole injection layer 13, the organic light-emitting layers 15, and the electron transport layer 16 are functional layers, and the functional layers are disposed between the pixel electrodes 12 and the common electrode 17.

Also, organic EL elements 10R, 10G, and 10B serve as sub-pixels. The organic EL elements 10R, 10G, and 10B each include an organic light-emitting layer 15 of a corresponding light-emission color, which is either red (hereinafter, R), green (hereinafter, G), or blue (hereinafter, B). As illustrated in FIG. 2, the sub-pixels are arranged to form a matrix in the display panel 100.

FIG. 2 illustrates a state where the electron transport layer 16, the common electrode 17, and the sealing layer 18 are removed.

[Ground Substrate]

The ground substrate 11 includes a substrate body 11a, thin-film transistor (TFT) layers 11b, and an interlayer insulation layer 11c.

The substrate body 11a serves as the base of the display panel 100, and may be formed by using, for example, an insulative material such as non-alkali glass, soda glass, polycarbonate resin, polyester resin, or aluminum oxide.

The TFT layers 11b are provided one for each of the sub-pixels of the display panel 100, on the surface of the substrate body 11a. Each TFT layer 11b has formed therein a pixel circuit that includes a TFT element.

The interlayer insulation layer 11c is formed on the TFT layers 11b. The interlayer insulation layer 11c is formed by using an organic insulative material such as a polyimide resin, an acrylic resin, or a novolac-type phenol resin, or an inorganic insulative material such as silicon oxide (SiO) or silicon nitride (SiN). The interlayer insulation layer 11c secures electrical insulation between the TFT layers 11b and the pixel electrodes 12. In addition, the interlayer insulation layer 11c planarizes any level difference on the top surfaces of the TFT layers 11b, and thereby suppresses the influence that such level differences would otherwise have with respect to the surface on which the pixel electrodes 12 are formed.

[Pixel Electrodes]

The pixel electrodes 12 are provided one for each of the sub-pixels of the display panel 100, on the ground substrate 11. The pixel electrodes 12 are formed by using a light-reflective electrically-conductive material, such as silver (Ag), aluminum (Al), an Al alloy, molybdenum (Mo), or APC (an alloy of silver, palladium, and copper). In this embodiment, the pixel electrodes 12 serve as anodes.

A conventional light-transmissive electrically-conductive film may be additionally provided on the surface of each pixel electrode 12. This light-transmissive electrically-conductive film may be formed, for example, by using indium tin oxide (ITO) or indium zinc oxide (IZO). The light-transmissive electrically-conductive films are disposed between the pixel electrodes 12 and the hole injection layer 13, and improve interlayer joining.

[Hole Injection Layer]

The hole injection layer 13 is formed, for example, by using an oxide of a metal such as Ag, Mo, chromium (Cr), vanadium (V), tungsten (W), nickel (Ni), or iridium (Ir), or an electrically-conductive polymer material such as PEDOT (a mixture of polythiophene and polystyrene sulfate). The hole injection layer 13, when formed by using a metal oxide, assists hole generation and ensures stable injection and transportation of holes to the organic light-emitting layers 15.

[Banks]

A plurality of parallel, linear lengthwise banks 14 are provided on the surface of the hole injection layer 13. In plan view, each of the lengthwise banks 14 is elongated and extends in the Y direction, and has a rectangular shape. The lengthwise banks 14 are formed by using an organic insulative material (for example, an acrylic resin, a polyimide resin, or a novolac-type phenol resin).

As illustrated in FIG. 3, each of the lengthwise banks 14 has a trapezoidal cross-section. Further, each pair of lengthwise banks 14 defines a concave space 20, whereby a plurality of concave spaces 20 (concave spaces 20R, 20G, 20B) are partitioned from one another by the lengthwise banks 14. At the bottom portion of each concave space 20, a plurality of pixel electrodes 12 are arranged along the Y direction and functional layers are disposed above the pixel electrodes 12. The functional layers include the hole injection layer 13, the organic light-emitting layer 15, and the electron transport layer 16.

The lengthwise banks 14 partition light-emitting elements 10 that are adjacent in the X direction from one another, and also serve as structural members that, when a wet process is performed for forming the organic light-emitting layers 15, prevent applied ink from overflowing.

As illustrated in FIG. 2, the display panel 100 also includes a plurality of widthwise banks 24. The widthwise banks 24 have smaller height than the lengthwise banks 14 (refer to FIG. 6A and FIG. 6B). The widthwise banks 24 are disposed in plurality in each concave space 20, each between pixel electrodes 12 that are adjacent in the Y direction. The widthwise banks 24 partition light-emitting elements 10 that are adjacent in the Y direction from one another.

The widthwise banks 24 are disposed at the same Y-direction positions in every concave space 20. Each widthwise bank 24 connects with adjacent widthwise banks 24 by extending in the X direction below lengthwise banks 14, and thus, when viewed as a whole, each widthwise bank 24 has a rectangular shape elongated in the X direction. Accordingly, the lengthwise banks 14 and the widthwise banks 24 together form a lattice structure over the ground substrate 11, as illustrated in FIG. 2.

[Organic Light-Emitting Layers]

The organic light-emitting layers 15 are portions emitting light through recombination of carriers (i.e., holes and electrons) occurring therein, and each contain an organic material corresponding to one of the colors R, G, and B.

The organic light-emitting layers 15 are disposed in the concave spaces 20 (refer to the concave spaces 20R, 20G, and 20B illustrated in FIG. 6A and FIG. 6B), which are partitioned from one another by the lengthwise banks 14, are elongated and extend in the Y direction, and have groove-like shapes.

In FIG. 6A and FIG. 6B, each concave space 20R is a concave space in which a light-emitting layer of the color R will be formed and thus, light-emitting elements 10R corresponding to the color R will be formed. Similarly, each concave space 20G is a concave space in which a light-emitting layer of the color G will be formed and thus, light-emitting elements 10G corresponding to the color G will be formed, and each concave space 20B is a concave space in which a light-emitting layer of the color B will be formed and thus, light-emitting elements 10B corresponding to the color B will be formed.

As such, each lengthwise bank 14 is disposed between two organic light-emitting layers 15 which differ in terms of color.

The organic light-emitting layers 15 may be formed, for example, by using a fluorescent substance such as polyphenylene vinylene (PPV), polyfluorene, oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group III metal, metal complex of oxine, or rare earth metal complex.

[Electron Transport Layer]

The electron transport layer 16 has the function of transporting electrons injected thereto from the common electrode 17 to the organic light-emitting layers 15, and is formed by using, for example, an oxidiazole derivative (OXD), a triazole derivative (TAZ), or a phenanthroline derivative (BCP, Bphen).

[Common Electrode]

The common electrode 17 is, for example, formed by using a light-transmissive material having electrically-conductive properties, such as ITO or IZO. The common electrode 17 extends across all sub-pixels of the display panel 100.

In this embodiment, the common electrode 17 serves as a cathode. [Sealing Layer 18] The sealing layer 18 is disposed to protect the hole injection layer 13, the organic light-emitting layers 15, the electron transport layer 16, and the common electrode 17 from water and oxygen.

Although not depicted in the drawings, black matrices, color filters, and/or the like may also be formed over the sealing layer 18.

[Display Panel Manufacturing Method]

Figure 4:
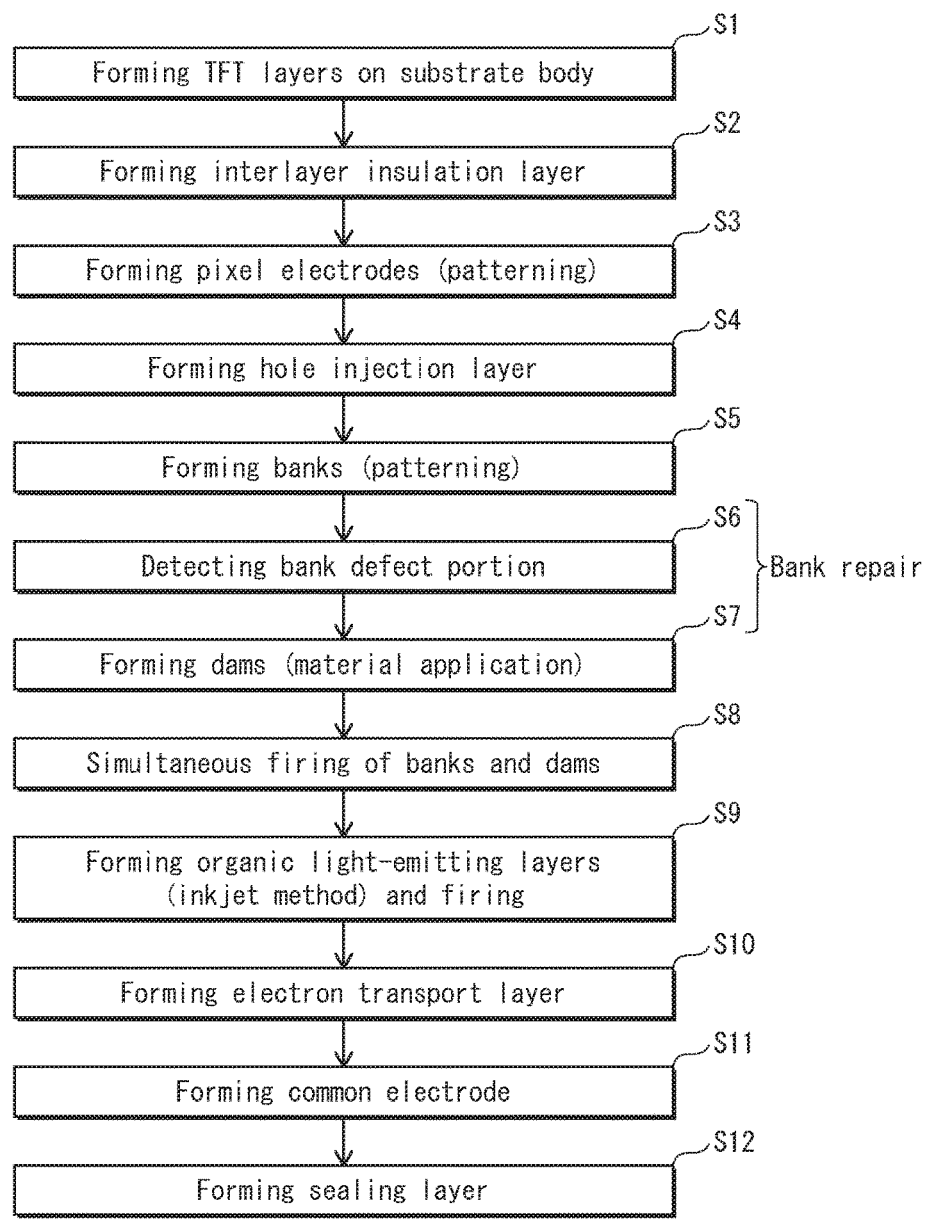
FIG. 4 is a schematic process diagram illustrating manufacturing procedures of the display panel.

FIG. 4 is a schematic process diagram illustrating manufacturing procedures of the display panel 100.

Each of FIG. 5A through FIG. 5E is a schematic cross-sectional view illustrating a part of the manufacturing process of the display panel 100.

The following describes the manufacturing method of the display panel 100 based on FIG. 4, which illustrates the procedures involved in the manufacturing process, and with further reference to FIG. 3 and FIG. 5A through FIG. 5E.

First, the TFT layers 11b are formed on the substrate body 11a (Step S1).

Subsequently, the interlayer insulation layer 11c is formed on the TFT layers 11b by using an organic material providing excellent electrical insulation and through a photoresist method, with which the preparation of the ground substrate 11 is completed (Step S2). The thickness of the interlayer insulation layer 11c is approximately 4 µm, for example. Although not depicted in the cross-sectional view of FIG. 3 nor in FIG. 4, which illustrates the procedures involved in the manufacturing process, contact holes 2 (see FIG. 2) are also formed during the forming of the interlayer insulation layer 11c.

Next, the pixel electrodes 12 are formed, one for each sub-pixel, by using a metallic material having a thickness of approximately 400 nm, through vacuum vapor deposition or sputtering (Step S3).

Then, the hole injection layer 13 is formed by uniformly forming a film of tungsten oxide over the ground substrate 11 and the pixel electrodes 12 through sputtering or the like (Step S4).

Subsequently, the lengthwise banks 14 and the widthwise banks 24 are formed through photolithography (Step S5), as described in the following.

First, bank material (e.g., a photosensitive photoresist material) for forming the widthwise banks 24 is applied uniformly over the hole injection layer 13.

Then, a photomask having openings matching the pattern of the widthwise banks 24 is placed over the layer of the applied bank material, and developing is performed through UV irradiation. The forming of the widthwise banks 24 is completed by subsequently removing unhardened, excess bank material by using a developing fluid.

Subsequently, bank material (e.g., a negative photosensitive resin composition) for forming the lengthwise banks 14 is applied uniformly over the substrate over which the widthwise banks 24 have been formed.

Then, bank patterning is performed by placing a mask having openings matching the pattern of the lengthwise banks 14 over the layer of the applied bank material, and performing irradiation with light from over the mask. The patterning of the lengthwise banks 14 having a predetermined pattern is completed by washing away any excess bank material with an alkaline developing fluid.

Figure 5A:
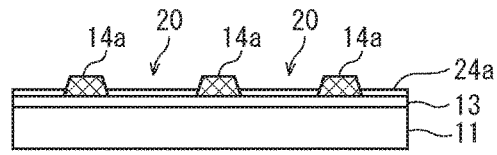
Figure 5B:
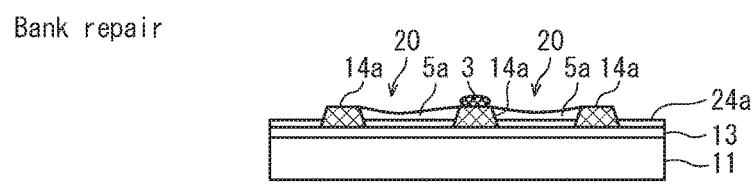

Unfired lengthwise banks 14a and unfired widthwise banks 24a are formed as a result of such patterning, as illustrated in FIG. 5B. At this point, a concave space 20 has already been formed between each pair of adjacent lengthwise banks 14a.

Next, the unfired lengthwise banks 14a, formed through the above-described patterning, are examined to detect defect portions (Step S6). Any defect portion detected is repaired.

The repairing is described in more detail later. Broadly speaking, a defect portion is repaired by applying a repair material with respect to concave spaces 20, in the vicinity of the defect portion, and then drying the repair material so applied (Step S7). FIG. 5B illustrates a state where unfired dams 5a have been formed by applying the repair material with respect to concave spaces 20.

Then, the lengthwise banks 14, the widthwise banks 24, and dams 5 are respectively produced by simultaneous thermal firing of the unfired lengthwise banks 14a, the unfired widthwise banks 24a, and the unfired dams 5a, thereby completing the repair of a defect portion 3 (Step S8). The simultaneous firing is, for example, performed by heating the unfired lengthwise banks 14a, the unfired widthwise banks 24a, and the unfired dams 5a at a temperature between 150° C. and 210° C. for 60 minutes.

Figure 5C:
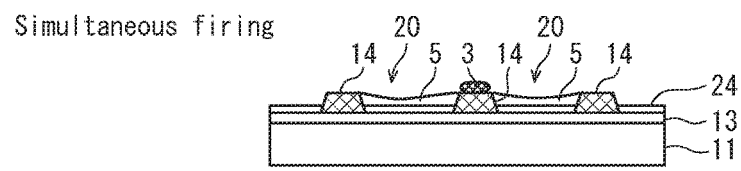

FIG. 5C illustrates a state where the dams 5, as well as the lengthwise banks 14 and the widthwise banks 24, have been formed by this firing, or in other words, a state where the lengthwise banks 14 have been formed through repairing.

The lengthwise banks 14 formed in this manner may be further subjected to a process of adjusting contact angle with respect to ink to be applied in the subsequent procedure. Alternatively, in order to provide hydrophobic properties to the surfaces of the lengthwise banks 14, processing such as surface processing using a predetermined alkaline solution, water, an organic solvent, etc., or plasma processing may be performed.

Figure 5D:
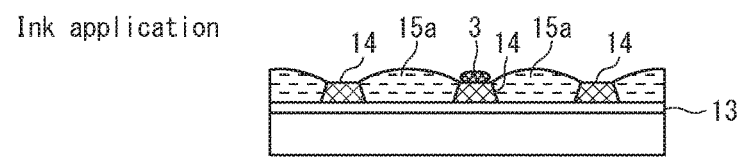

Next, inks for forming the light-emitting layers are applied with respect to the concave spaces 20, as illustrated in FIG. 5D. Each ink is a mixture of an organic material for the corresponding organic light-emitting layers 15 and a solvent, and is applied with respect to the inside of concave spaces 20 using an inkjet method.

Figure 5E:
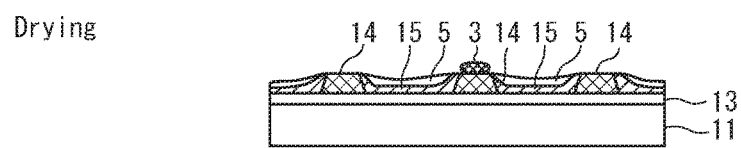

Ink layers 15a formed through the ink application are then dried by causing the solvent contained in the ink layers 15a to evaporate, and thermal firing is performed when necessary. Thus, the organic light-emitting layers 15 are formed in the concave spaces 20, as illustrated in FIG. 5E (Step S9).

Next, the electron transport layer 16 is formed over the organic light-emitting layers 15 and the lengthwise banks 14 by depositing a film of a material for the electron transport layer 16 through vacuum vapor deposition (Step S10).

The common electrode 17 is then formed by depositing a film of a material such as ITO or IZO through sputtering or the like (Step S11).

Then, the sealing layer 18 is formed by depositing a film of a light-transmissive material such as SiN or SiON over the surface of the common electrode 17 through sputtering, CVD, or the like (Step S12).

The manufacturing of the display panel 100 is completed through the above-described procedures.

[Method for Detecting and Repairing Defect Portion]

As described above in connection with the manufacturing method, but in more precise terms, the lengthwise banks 14, the widthwise banks 24, and the dams 5 are respectively formed by thermal firing and curing of the unfired lengthwise banks 14a, the unfired widthwise banks 24a, and the unfired dams 5a having been formed. However, the unfired lengthwise banks 14a and the unfired dams 5a are somewhat solidified and already have stable shapes. As such, in the present disclosure, description is provided while simply referring to the unfired lengthwise banks 14a and the unfired dams 5a by using the terms lengthwise banks 14a and dams 5a, respectively.

[Defect Portion 3]

The following first describes a defect portion 3 of a lengthwise bank 14a.

The defect portion 3 may be a foreign particle present at the lengthwise bank 14a, or may be a missing portion of the lengthwise bank 14a.

The foreign particle may be, for example, a piece of metal originating in manufacturing equipment, or dust/dirt originating in the atmosphere. The dust/dirt tends to be a piece of fabric.

FIG. 6A illustrates an example in which a foreign particle has adhered onto one lengthwise bank 14a and has become a defect portion 3.

When dome-shaped ink layers 15a are formed as illustrated in FIG. 5D by applying ink with respect to adjacent concave spaces 20 between which a lengthwise bank 14a having a foreign particle is located, there is a risk of the ink layers 15a coming in contact with the foreign particle. Consequently, inks of different light-emission colors (e.g., red ink and green ink) may mix.

FIG. 7A illustrates an example where a defect portion 3 is formed by a foreign particle that has entered the inside of a lengthwise bank 14a penetrating through a wall surface of the lengthwise bank 14 into an adjacent concave space 20.

FIG. 7B illustrates an example where a defect portion 3 is formed by a foreign particle that has slipped beneath a lengthwise bank 14a penetrating into an adjacent concave space 20.

With a foreign particle inside or beneath a lengthwise bank 14a, a gap serving as an ink flow channel may be formed, given poor adhesion between the foreign particle and the bank material. Particularly, when the foreign particle is a piece of fabric, the foreign particle itself unfortunately serves as an ink flow channel by absorbing ink. As such, even when a defect portion 3 is formed by a foreign particle inside or beneath a lengthwise bank 14a, the defect portion 3 may bring about color mixture between ink layers 15a formed in adjacent concave spaces between which the foreign particle is located.

Further, FIG. 7C illustrates an example where a defect portion 3 is formed by a portion of a lengthwise bank 14a collapsing. A portion of a lengthwise bank 14a may collapse in such a manner, for example, when a portion of a bank material layer not having undergone sufficient polymerization in the bank material layer light exposure process, due to not being exposed to enough light, is washed away during the subsequent developing process. Even when a defect portion 3 is formed by a portion of a lengthwise bank 14a collapsing, the collapsed portion may mediate color mixture between ink layers 15a formed in adjacent concave spaces between which the collapsed portion is located.

When the display panel 100 is manufactured using a panel whose light-emitting layer has a color mixture region, the color mixture region emits light of a color differing from the originally intended color. Typically, when fluorescent substances of different light-emission colors mix, the light-emission color having longer wavelength becomes dominant.

For example, a color mixture region produced through mixing of red ink and green ink, such as the color mixture region illustrated in FIG. 16B, emits light with the color red dominant over the color green. Accordingly, a color mixture region formed in a region intended to emit green light turns out to be dominated by the color red. Thus, when such a color mixture region spreads, an area with light-emission color failure increases, which may result in display failure.

As described above, mixture of inks of different light-emission colors occurs at a portion of a lengthwise bank 14a where a foreign particle is present and at a collapsed portion of a lengthwise bank 14a, and the mixture of such inks may lead to display failure. As such, such portions of lengthwise banks 14a are referred to as defect portions 3.

Further, when a foreign particle is present inside or beneath a lengthwise bank 14a as illustrated in FIG. 7A and FIG. 7B, the lengthwise bank 14a bulges upwards and has relatively great height at the portion where the foreign particle is present. Meanwhile, when a portion of a lengthwise 14a has collapsed as illustrated in FIG. 7C, the lengthwise bank 14 has relatively small height at the portion.

[Detection of Defect Portion 3]

The detection of a defect portion 3 of a lengthwise bank 14a is performed by, for example, capturing an image of the surfaces of the lengthwise banks 14a formed over the ground substrate 11, and performing a pattern search on the image.

FIG. 8 illustrates the overall structure of one example of a repair device used for detecting and repairing bank defect portions.

The repair device illustrated in FIG. 8 (repair device 200) includes a base 201, and a table 202 and a head portion 210 over the base 201. The table 202 is a table on which the ground substrate 11 is placed. The head portion 210 has attached thereto an image capture element 211 and a dispenser 212. The table 202 is moveable along the Y direction in accordance with an instruction from a controller 230. The head portion 210 is likewise moveable along the X direction and the Z direction in accordance with an instruction from the controller 230.

Accordingly, in accordance with an instruction from the controller 230, the image capture element 211 and the dispenser 212, which are attached to the head portion 210, are capable of moving above the ground substrate 11 and in the X direction, the Y direction, and the Z direction relative to the ground substrate 11, which is placed on the table 202.

FIG. 9 is a flowchart illustrating one example of the operations of the repair device 200 for detecting defect portions. Note that in the flowchart in FIG. 9, B indicates identification numbers provided to the lengthwise banks 14a formed over the ground substrate 11.

An examination of whether or not a defect portion 3 is present is performed with respect to lengthwise banks 14a by using the repair device 200, starting from the lengthwise bank 14a with the first value of B and ending at the lengthwise bank 14a with the final value of B, by repeating the processing in Steps S21 through S26 while causing the image capture element 211 to move along the top surface of the ground substrate 11.

Specifically, this is performed according to the following method. First, image data of the top surface of the ground substrate 11 (the lengthwise banks 14a and the widthwise banks 24a) is acquired, and the image data is stored in a storage unit 231 of the controller 230. The controller 230 then compares portions of lengthwise banks 14a in the image data one after another, and detects a difference as a defect portion 3.

Then, when detecting a defect portion 3 (YES in Step S23), the controller 230 stores position data (X-direction position and Y-direction position Yo) of a center O of the defect portion 3 so detected in the storage unit 231 (Step S24). Upon completing the examination up to the lengthwise bank 14a with the final value of B, the controller 230 terminates processing (Step S25).

During this detection process, there is a possibility of a defect portion 3 being detected in several lengthwise banks 14a formed over the ground substrate 11, and also there is a possibility of no defect portion 3 being detected in any of the lengthwise banks 14a.

When a defect portion 3 is detected in any of the lengthwise banks 14a, the defect portion 3 is repaired.

[Method for Repairing Bank Having Defect Portion]

Next, a lengthwise bank 14a having a defect portion 3 is repaired by causing the dispenser 212 to apply a repair material for forming dams over the ground substrate 11 mounted on the table 202 so as to surround the defect portion 3 and form dams 5.

Here, as illustrated in FIG. 6B, dams 5 are formed in each of the adjacent concave spaces 20 between which the lengthwise bank 14a having the defect portion 3 is located. Specifically, in each concave space 20, dams 5 are formed such that one of the dams 5 extends from point $A_1$ to an adjacent lengthwise bank 14a, and the other of the dams 5 extends from point $A_2$ to the adjacent lengthwise bank 14a. The points $A_1$ and $A_2$ are located at different sides of the defect portion 3 in the Y direction. Accordingly, a total of four dams 5 are formed in a lattice structure in the concave spaces 20 around the defect portion 3. The dams 5 partition the concave spaces 20 in the X direction. Further, the dams 5 in each concave space 20 are formed between two widthwise banks 24 that are adjacent in the Y direction.

The dispenser 212 of the repair device 200 is a needle dispenser, and has a tank 214 attached at a tip portion thereof. The tank 214 stores the repair material. The needle dispenser 212 is capable of applying the repair material in microliter units by moving the needle 213 up and down through the tank 214 to cause the repair material to adhere to the needle 213.

The needle 213 of the dispenser 212 is driven in accordance with a control signal from the controller 230.

Note that the repair material may be any resin composition that hardens when exposed to light, heat, or the like.

The resin may be, for example, a curable resin containing an ethylene double bond, such as a (meth) acryloyl group, an aryl group, a vinyl group, or a vinyloxy group.

Also, a cross-linking agent, such as an epoxy compound or a polyisocyanate compound, that forms a cross-link with the resin may also be contained in the repair material as an additive.

The resin in the repair material may be a fluoride polymer, which includes fluoride in the resin structure. Introducing fluoride into the resin of the repair material provides ink repellency to the dams 5 formed by using the repair material. Alternatively, various ink repelling agents may be added to the resin. In any case, the content of ink repelling agent should be within the range from 0.01 wt % to 10 wt %. Adding an ink repelling agent by an amount within this range ensures that the resin compound is stable during storage, and also provides the dams 5 formed by using the repair material with excellent ink repellency.

Also, the same material as the bank material used for forming the lengthwise banks 14a may be used as the repair material. Here, it should be noted that bank material typically includes an acid component that is soluble to an alkaline developing fluid. However, it is preferable that the repair material for forming the dams does not include such an acid component. This is because developing is not performed in the forming of the dams 5, and thus, acid component remaining in the dams 5 would render the dams 5 vulnerable to solvents.

Further, the resin composition in the repair material may contain a solvent and a photopolymerization initiator as additives, when necessary.

The solvent is a solvent dissolving the resin, and one or more types of solvents having a boiling point approximately within the range from 150° C. to 250° C. may be used.

The photopolymerzation initiator may be any type of photopolymerization initiator available on the market.

Further, upon the application of the repair material, the repair material is to be adjusted so that for example, the content of solid components in the repair material is within the range from 20 wt % to 90 wt % and the repair material has a viscosity within the range from 10 cP to 50 cP (where cP is the unit centipoise).

Further, the amount of the photopolymerization initiator added is adjusted in accordance with the amount of light exposure in the light exposure process. For example, the amount of the photopolymerzation initiator added is to be adjusted such that the content of the photopolymerzation initiator with respect to the total solid component of the repair material is within the range from 0.1 wt % to 50 wt %, and more preferably, within the range from 5 wt % to 30 wt %.

A dam 5a in any concave space 20 is formed by using the needle dispenser 212 and applying the repair material with respect to a plurality of predetermined positions along a line (dam forming line) on which the corresponding dam 5 is to be formed.

In this embodiment, the setting of Y-direction positions of dam forming lines is performed so that the Y-direction distance between dams 5 that are to be formed is no shorter than an ink dropping pitch $W_1$. The setting of Y-direction positions of dam forming lines is performed in such a manner to ensure that there is an ink dropping point between the dams 5. An ink dropping point is a point onto which ink is dropped in the subsequent light-emitting layer forming process (Step S9 in FIG. 4).

The following describes in specific how the repair device 200 performs the forming of dams.

As described later in the present disclosure, in this embodiment, the subsequent light-emitting layer forming process (Step S9 in FIG. 4) is performed with a Y-direction position of a nozzle head 322 set to a standard position. Due to this, the positions of the ink dropping points (i.e., the positions where ink is dropped) over the ground substrate 11 are as illustrated in FIG. 15B. Specifically, a center of a group of a plurality of (six) ink dropping points lining up in the Y direction at the pitch $W_1$ matches a Y-direction center Co of a space between a pair of widthwise banks 24. The following describes the dam forming process performed by the repair device 200 based on this.

FIG. 10 is a flowchart illustrating one example of the operations of the repair device 200 in the dam forming process. In FIG. 10, n indicates identification numbers provided to one or more defect portions 3 having been detected over the ground substrate 11.

The setting of dam forming lines is performed as described in the following for each of the defect portions 3, starting from the defect portion 3 with the first value of n and ending at the defect portion 3 with the final value of n.

First, the Y-direction position Yo of the center O of the first defect portion 3 is read out (Step S32).

Subsequently, a distance d between the position Yo and the Y-direction center Co of the space between widthwise banks 24 is calculated (Step S33). The calculation of the distance d is expressed by: d=|Yo−Co|.

When the distance d is $3 \times W_1$ or smaller (Yes in Step S34), there is an ink dropping point at a distance of $\frac{1}{2} \times W_1$ or smaller from the Y-direction center Yo of the defect portion 3. Thus, two dam forming lines with the respective Y-direction positions of Yo+($W_1$+T)/2 and Yo−($W_1$+T)/2 are set (Step S35). Here, T is set to a value indicating an expected width of each dam 5, and for example, equals 10 μm. Alternatively, T may be set to a value greater than the width of each dam 5.

Setting positions of dam forming lines as described above ensures that there is a space of $W_1$ or greater between the two dams 5 to be formed.

Meanwhile, when the distance d is $3 \times W_1$ or greater (No in Step S34), a widthwise bank 24 is located near the defect portion 3 in the Y direction. Thus, it can be considered that a distance between the center position Yo of the defect portion 3 and an ink dropping point nearest the defect portion 3 is greater than $\frac{1}{2} \times W_1$. Thus, in this case, in order to ensure that the nearest ink dropping point is located in the space between the two dams 5 to be formed, two dam forming lines with the respective Y-direction positions of Yo+(d−2.5 $W_1$+T/2) and Yo−(d−2.5 $W_1$+T/2) are set (Step S36).

Note that the positions of the dam forming lines set in Steps S35 and S36 above are mere examples of positions for ensuring that there is an ink dropping point in the space between the dams 5 to be formed. For example, the distance between the dam forming lines to be formed may be set to be greater than those in the examples described above.

Following this, when defect portions 3 with the second and subsequent values of n exist (NO in Step S37 and Step S38), the setting of dam forming lines is performed in the similar manner for each of these defect portions 3, until setting of Y-direction positions of dam forming lines has been performed for the defect portion 3 with the final value of n (YES in Step S37).

FIG. 11A illustrates application positions set around a defect portion 3 in an image. As illustrated in FIG. 11A, in each of the adjacent concave spaces between which the lengthwise bank 14a having the defect portion 3 is located, a dam forming line extending in the X direction through point $A_1$ and a dam forming line extending in the X direction through point $A_2$ are set. Point $A_1$ is located at a distance $a_1$ in the Y direction from a center O of the defect portion 3, and point $A_2$ is located at a distance $a_2$ in the direction opposite the Y direction from the center O of the defect portion 3.

Subsequently, dams 5 are formed as described in the following, along the dam forming lines set as described above for each defect portion 3 (Step S39 in FIG. 10). First, application points $P_1$, $P_2$, $P_3$, and $P_4$ are set along each dam forming line.

FIG. 11B is a schematic cross-sectional view illustrating a cross-section of the ground substrate 11 taken along the dam forming line passing through point $A_1$.

The repair device 200 forms a dam 5a by applying the repair material with respect to the application points $P_1$, $P_2$, $P_3$, and $P_4$ one after another, by using the needle 213.

FIG. 12A through FIG. 12G illustrate how a dam 5a is formed by applying the repair material with respect to the application points $P_1$, $P_2$, and so on one after another.

First, as illustrated in FIG. 12A and FIG. 12B, with the needle 213 and the tank 214 positioned at application point $P_1$, the needle 213 is moved downward so that the repair material adheres to the needle 213. Then, the needle 213 is moved toward application point $P_1$ to apply the repair material with respect to application point $P_1$.

The repair material has fluidity until application. However, after application, the repair material maintains a mound shape. Thus, as illustrated in FIG. 12C, a mound of the repair material is formed at application point $P_1$.

Subsequently, as illustrated in FIG. 12D, the needle 213 is withdrawn upwards into the tank 214, and the needle 213 and the tank 214 are moved to application point $P_2$. Then, the needle 213 is moved downward so that the repair material adheres to the needle 213, and the needle 213 is moved toward application point $P_2$ to apply the repair material with respect to application point $P_2$.

Thus, as illustrated in FIG. 12E, a mound of the repair material is formed at application point $P_2$. This mound of the repair material connects to the mound of the repair material having been formed at application point $P_1$.

Then, as illustrated in FIG. 12F, the needle 213 is withdrawn upwards and moved to application point $P_3$. Then, in a similar manner as described above, a mound of the repair material is formed at application point $P_3$, which connects to the mound of the repair material having been formed at application point $P_2$.

As such, mounds of the repair material are formed continuously to form a line extending from point $A_1$ on the lengthwise bank 14a having the defect portion 3 to an adjacent lengthwise bank 14a. Then, the mounds of the repair material so applied are dried and exposed to light as needed, thereby forming a dam 5a.

Note that the subsequent simultaneous firing process causes the repair material so applied to harden. Thus, a dam 5 having high physical stability are formed.

Through the above-described dam forming process, a pair of dams 5 is formed in each of two concave spaces 20 between which a lengthwise bank 14 having a defect portion 3 is located, as illustrated in FIG. 6B. The dams 5 in each concave space 20 partition the concave space 20 into a first space SA in the vicinity of the defect portion 3, and two second spaces SB not in the vicinity of the defect portion 3. Accordingly, the defect portion 3 is surrounded by two first spaces SA.

By performing the subsequent light-emitting layer forming process of Step S9 after repairing any defect portion 3 of any lengthwise bank 14 in such a manner, ink can be applied with respect to both first spaces SA and second spaces SB, whereby organic light-emitting layers 15 are formed while confining color mixture regions where ink mixing takes place as described later in the present disclosure.

[Forming of Light-emitting Layers]

In the light-emitting layer forming process (Step S9 in FIG. 4), ink is ejected into each concave space 20 over the ground substrate 11 using the nozzle head 322 of an inkjet device 300, and the organic light-emitting layers 15 are formed by drying the ink so ejected.

(Structure of Inkjet Device 300)

FIG. 13 illustrates the structure of an inkjet device 300. FIG. 14 is a functional block diagram of the inkjet device 300.

As illustrated in FIG. 13, the inkjet device 300 includes a work table 310 and a head unit 320. The substrate 11 having the banks formed thereon, with respect to which ink application is performed, is placed on the work table 310. The head unit 320 has a plurality of nozzles from which ink is ejected.

The work table 310 is a so-called gantry table, and includes a base 311 and a moving frame 312. The base 311 holds the ink ejection target object. The moving frame 312 is arranged over the base 311 and has an elongated shape.

FIG. 13 illustrates a state where the ground substrate 11 having the banks formed thereon is placed on the base 311.

The moving frame 312 is suspended across a pair of guide shafts 313a and 313b arranged in parallel along the longside direction of the base 311 (the X direction). The guide shafts 313a and 313b are supported by stands 314a, 314b, 314c, and 314d, which are columnar and disposed at four corners of the base 311. The moving frame 312 can be moved in the X direction along the guide shafts 313a and 313b by linear motor units 315a and 315b.

The moving frame 312 has a mount 316 having an L shape attached thereto. The head unit 320 is attached to this mount 316. Thus, the head unit 320 can be moved in the X direction by driving the linear motor units 315a and 315b, and can be moved in the Y direction by driving a servomotor unit 317.

The head unit 320 includes the nozzle head 322. The nozzle head 322 is attached to the mount 316 via a head support unit 321.

The linear motor units 315a and 315b and the servomotor unit 317 are connected to a drive control unit 319 illustrated in FIG. 14. The drive control unit 319 is connected to a CPU 331 of a control device 330 via communication cables 301 and 302.

(Head Unit 320)

As described above, the head unit 320 includes the nozzle head 322, which is elongated in the Y direction. Ink is supplied to the nozzle head 322 from the outside, via a fluid supply tube 304.

While not illustrated in FIG. 13, the nozzle head 322 has, at a bottom surface thereof, a plurality of nozzles 325 that are arrayed in the Y direction (refer to FIG. 15A). The nozzles 325 of the nozzle head 322 are positioned such that a group of a predetermined number of nozzles 325 (a group of six nozzles 325) passes over each space between widthwise banks 24 adjacent in the Y direction at the same positional relationship. Further, in each group of the predetermined number of nozzles 325 (each group of six nozzles 325), the nozzles 325 are disposed at the same pitch.

Further, each nozzle 325 has an ink ejection mechanism (undepicted) including at least a piezoelectric element and a liquid chamber.

The head unit 320 houses a eject controller 327 (refer to FIG. 14). The eject controller 327 has a drive circuit for individually driving the piezoelectric elements of the nozzles 325. The eject controller 327 controls the drive signals supplied to the piezoelectric elements and thereby causes ink droplets to be ejected from the ejection outlets of the nozzles 325. The eject controller 327 is connected to the CPU 331 of the control device 330 via a communication cable 303.

(Control Device 330)

In addition to the CPU 331, the control device 330 includes a storage means 332, an input means 333, and a display means (a display) 334. Specifically, the control device 330 is implemented by using a personal computer (PC).

The storage means 332 stores, for example, control programs for driving the work table 310 and the head unit 320, which are connected to the control device 330. When the inkjet device 300 is driven, the CPU 331 controls components of the inkjet device 300 according to instructions input by an operator via the input means 333 and according to the control programs that are stored in the storage means 332.

Specifically, the storage means 332 stores, for example, the Y-direction standard position of the nozzle head 322 over the ground substrate 11 having the banks formed thereon, and X-direction positions of the ground substrate 11 having the banks formed thereon where ink is to be dropped (i.e., positions of ink dropping lines $Q_1$ and $Q_2$ illustrated in FIG. 15A and FIG. 15B).

For example, based on a predetermined control program stored in the storage means 332, the CPU 331 drives the linear motor units 315a and 315b and the servomotor unit 317 by providing instructions to the drive control unit 319, and applies drive voltages to the piezoelectric elements of the nozzle head 322 by providing instructions to the eject control unit 327.

Note that the Y-direction standard position of the nozzle head 322 is set such that when the nozzle head 322 is in this position, a center of a group of a plurality of ink dropping points (a group of six ink dropping points) lining up in the Y direction matches the Y-direction center Co of a space between a widthwise bank 24A and a widthwise bank 24B that are adjacent in the Y direction, as illustrated in FIG. 15B. As such, when the Y-direction position of the nozzle head 322 is the standard position, a distance $W_2$ between the widthwise bank 24A and the ink dropping point nearest thereto is equal to a distance $W_3$ between the widthwise bank 24B and the ink dropping point nearest thereto (i.e., $W_2=W_3$).

Further, the input means 333 is capable of receiving input of a shift amount $\Delta W$ from the operator. The shift amount $\Delta W$ is for adjusting the Y-direction position of the nozzle head 322.

This shift amount $\Delta W$ is a value (a positive number, a negative number, or zero) indicating how far the nozzle head 322 is to be shifted in the Y direction from the standard position. According to the shift amount $\Delta W$ input to the input means 333, the CPU331 performs the control described in the following.

When the shift amount $\Delta W$ input to the input means 333 indicates zero (i.e., when $\Delta W=0$), the CPU 331 provides an instruction to the drive control unit 319 to cause the servomotor unit 317 to operate and thereby positions the nozzle head 322 at the standard position. Subsequently, the CPU 331, while driving the linear motor units 315a and 315b to move the nozzle head 322 in the X direction, causes ink to be ejected by providing the eject control unit 327 with an instruction to cause the piezoelectric elements of the nozzles head 322 to operate. Thus, ink is dropped to the ink dropping points in the concave spaces 20 over the ground substrate 11 having the banks formed thereon.

Meanwhile, when the shift amount $\Delta W$ input to the input means 333 indicates a value other than zero, the CPU 331 provides an instruction to the drive control unit 319 to cause the servomotor unit 317 to operate and thereby positions the nozzle head 322 at a position shifted from the standard position by the shift amount $\Delta W$. Subsequently, similar to the above-described case, the CPU 331, while driving the linear motor units 315a and 315b to move the nozzle head 322 in the X direction, causes ink to be ejected by providing the eject control unit 327 with an instruction to cause the piezoelectric elements of the nozzles head 322 to operate.

Note that while it is the head unit 320 that is driven in the X and Y directions in the inkjet device 300 described above, the mount 311 may be driven in the X and Y directions instead of the head unit 320. Driving the mount 311 in such a manner also achieves moving the nozzle head 322 in the X and Y directions relative to the ground substrate 11 having the banks formed thereon.

(Ink Application for Forming Light-Emitting Layers by Inkjet Device 300)

The following describes operations when using the inkjet device 300 with the above-described structure to apply inks for forming light-emitting layers onto the ground substrate 11 having the banks formed thereon.

The operator places the ground substrate 11 having the banks formed thereon on the mount 311 of the inkjet device 300, as illustrated in FIG. 13. Here, the ground substrate 11 having the banks formed thereon is placed on the mount 311 so that the direction in which the lengthwise banks 14 extend (i.e., the Y direction) is parallel with the longitudinal direction of the nozzle head 322.

Subsequently, the operator inputs the shift amount $\Delta W$ to the input means 333. Note that in the present embodiment, an assumption is made that the operator inputs zero as the shift amount $\Delta W$ (i.e., $\Delta W=0$) in order to operate the nozzle head 322 at the standard position.

Accordingly, the inkjet device 300 performs ink application by ejecting ink into each concave space 20 of the ground substrate 11 having the banks formed thereon from the nozzle head 322, while moving the nozzle head 322 in the X direction with the nozzle head 322 in the standard position in the Y direction.

FIG. 15A is a plan view illustrating how inks of light-emission colors R, G, and B are respectively dropped into concave spaces 20R, 20G, 20B, while the nozzle head 322 is moved in the X direction as described above.

FIG. 15A illustrates an example where, in each concave space 20, a plurality of ink dropping points are set along each of two ink dropping lines $Q_1$ and $Q_2$ extending in the Y direction. Specifically, due to six ink dropping points being set along each of the ink dropping lines $Q_1$ and $Q_2$, the total number of ink dropping points per sub-pixel is twelve. Further, the Y-direction pitch $W_1$ of the ink dropping points is equal to the pitch of the nozzles 325 in the nozzle head 322.

Note that while each of FIG. 13 and FIG. 15A illustrates only one nozzle head 322 for simplicity of explanation, the inkjet device 300 preferably has a nozzle head 322 for each color. Using these nozzle heads 322, the inkjet device 300 preferably ejects red ink into concave spaces 20R corresponding to the color red from the nozzle head 322 for red ink, ejects green ink into concave spaces 20G corresponding to the color green from the nozzle head 322 for green ink, and ejects blue ink into concave spaces 20B corresponding to the color blue from the nozzle head 322 for blue ink.

Accordingly, by applying inks of the corresponding colors into the concave spaces 20R, 20G, and 20B and subsequently drying the inks so applied, the organic light-emitting layers 15 are formed.

[Prevention of Ink Unwetting by Form of Dams 5]

When ink unwetting occurs in a first space SA (space between dams 5) or a second space SB (space outside dams 5), an organic light-emitting layer 15 is not formed at the area where ink unwetting has occurred. Due to this, when the display panel 100 that is manufactured is driven, lighting failure may occur due to current leakage occurring between a pixel electrode 12 and the common electrode 17.

Based on this, in applying ink to a concave space 20 having the dams 5 formed therein, it is necessary to drop ink into both the first space SA and the second spaces SB in order to ensure excellent display performance of the display panel 100.

In particular, ink unwetting as described above is more likely to occur in the first space SA than in the second spaces SB because the first space SA, which is the space between a pair of dams 5, is smaller than the second spaces SB. This is because it is preferable that the Y-direction distance between the pair of dams 5 be as small as possible for the following reason. That is, while the Y-direction distance between the pair of dams 5 needs to be great enough to ensure that a defect portion 3 to be repaired is between the two dams 5, it is preferable that the Y-direction distance between the dams 5 be set to be no greater than the Y-direction length of a sub-pixel and as small as possible to suppress color mixture region size.

The following describes a form of the dams 5 preferable for preventing the occurrence of ink unwetting in a first space SA.

FIG. 15B is a schematic illustrating the area around the defect portion 3 in FIG. 15A. The condition regarding shape, etc., of the dams 5 that needs to be satisfied in order for the dams 5 to ensure that there is an ink dropping point in the first space SA is basically that in the first space SA, at least one of the ink dropping lines $Q_1$ and $Q_2$ has a length greater than the pitch $W_1$, which is the pitch of ink dropping points along the ink dropping lines $Q_1$ and $Q_2$.

In this embodiment, a pair of a dam 5A and a dam 5B is formed in the vicinity of the defect portion 3, and the dams 5A and 5B face one another in the Y direction. Thus, the space between the dams 5A and 5B is the first space SA in this embodiment. Further, the dams 5A and 5B are formed to extend in the X direction, and thus are parallel with one another. Due to this, in this embodiment, it suffices to set a distance $L_1$ between the dams 5A and 5B to be greater than the pitch $W_1$.

Specifically, this can be achieved by setting the Y-direction positions of the dam formation lines in the dam forming process (Step S8) so that $L_1 > W_1$ is satisfied. When this condition is satisfied, it can be basically ensured that there is an ink dropping point in the first space SA between the dams 5A and 5B, without performing any adjustment of the Y-direction position of the nozzle head 322.

Based on this, in the dam forming process described above, the Y-direction distance between dams 5 formed for a defect portion 3 is set to be greater than or equal to the ink dropping pitch $W_1$, and this applies to every defect portion 3.

Specifically, in Steps S34 through S36 in the dam forming process illustrated in FIG. 10, the dam formation lines forming a pair that are set in Step S35 when YES in Step S34 are separated from one another by distance ($W_1$+T). Thus, the Y-direction distance between the dams 5 that are formed along the dam formation lines is equal to the ink dropping pitch $W_1$. Further, the dam formation lines forming a pair that are set in Step S36 when NO in Step S34 are separated from one another by distance (2d−5$W_1$+T). Thus, the Y-direction distance between the dams 5 that are formed along the dam formation lines equals (2d−5 $W_1$). Here, because 2d>6$W_1$ is satisfied when NO in Step S34, the Y-direction distance between the dams 5 that are formed is consequently greater than or equal to $W_1$.

As such, regardless of whether the dam formation lines are set in Step S35 or S36, it is ensured that there is an ink dropping point between the dams that are formed.

Typically, the ink dropping point pitch $W_1$ is around 20 μm or greater. Thus, in order to ensure that there is an ink dropping point in the first space SA between dams 5A and 5B, it can also be said that it is preferable to set the distance $L_1$ between the dams 5A and 5B to be greater than 20 μm (i.e., so that $L_1 > 20$ μm is satisfied).

Forming the dams 5 as described above ensures that in a concave space 20 in which the dams 5 have been formed, ink is applied to both the first space SA and the second spaces SB and an organic light-emitting layer 15 covers both the first space SA and the second spaces SB.

[Prevention of Ink Unwetting at Gap between Dam 5 and Widthwise Bank 24]

When there is a gap between a dam 5 and a widthwise bank 24 in a second space SB, ink unwetting is also likely to occur at such a gap. Thus, it is preferable to ensure that ink is dropped into such a gap, in order to prevent such ink unwetting.

For example, in the example illustrated in FIG. 15B, there is a gap ($L_2$) between the dam 5A and the widthwise bank 24A. Due to this, it is preferable to drop ink into the gap in order to prevent ink unwetting at the gap. Similarly, there is a gap ($L_3$) between the dam 5B and the widthwise bank 24B. It is preferable to drop ink into the gap in order to prevent ink unwetting at the gap.

The following considers a Y-direction position of the dam 5A ensuring that there is an ink dropping point between the dam 5A and the widthwise bank 24A.

Basically, it can be ensured that there is an ink dropping point in the gap between the dam 5A and the widthwise bank 24A by setting the Y-direction position where the dam 5A is to be formed so that in the gap between the dam 5A and the widthwise bank 24A, at least one of the ink dropping lines $Q_1$ and $Q_2$ has a length greater than a distance $W_2$ between the widthwise bank 24A and an ink dropping point nearest the widthwise bank 24A.

With the shape of the dams 5 pertaining to this embodiment, the ink dropping lines $Q_1$ and $Q_2$ both have a length $L_2$ in the gap between the dam 5A and the widthwise bank 24A. Thus, it suffices to set the Y-direction position of the dam 5A (i.e., the position of the corresponding dam forming line) so that $L_2 > W_2$ is satisfied.

Further, in this embodiment, the nozzle head 322 is moved with the nozzle head 322 in the standard position in the Y-direction position. Thus, $W_2 = W_3$ is satisfied. Further, in this case, the value of $W_2$ ($W_3$) can be expressed as $W_2 = [L_0 − 5W_1] \div 2$, using sub-pixel length $L_0$, the number of ink dropping points (i.e., 6), and the pitch $W_1$ of ink dropping points. Accordingly, it suffices to set the position of the dam forming line so that $L_2$ ($L_3$) is greater than $W_2$ ($W_3$) calculated as described above.

Accordingly, it can be said that when the distance $W_2$ is around 20 μm, it is preferable to set $L_2$ to be longer than 20 μm (i.e., so that $L_2 > 20$ μm is satisfied).

Similarly, it can be ensured that there is an ink dropping point in the gap between the dam 5B and the widthwise bank 24B by setting the Y-direction position of the dam 5B so that in the gap between the dam 5B and the widthwise bank 24B, at least one of the ink dropping lines $Q_1$ and $Q_2$ has a length $L_3$ greater than the distance $W_3$ between the widthwise bank 24B and an ink dropping point nearest the widthwise bank 24B (i.e., so that $L_3 > W_3$ is satisfied). Further, it can be said that it is preferable to set $L_3$ to be longer than 20 μm (i.e., so that $L_3 > 20$ μm is satisfied).

[Prevention of Color Mixture by Manufacturing Method pertaining to Present Embodiment]

The following describes how ink color mixture can be prevented by repairing a defect portion 3 of a lengthwise bank 14 by forming the dams 5.

FIG. 16A is a plan view illustrating a state where, in a panel pertaining to the embodiment, dams 5 have been formed around the lengthwise bank 14 having the defect portion 3, and then an ink layer 15a (R) has been formed in one of the two adjacent concave spaces 20 between which the lengthwise bank 14 is located through the application of red ink and an ink layer 15a (G) has been formed in the other one of the two adjacent concave spaces 20 through the application of green ink. Meanwhile, FIG. 16B is a plan view illustrating a state where, in a comparative example where forming of dams 5 is not performed, an ink layer 15a (R) and an ink layer 15a (G) have been formed in two adjacent concave spaces 20 between which the lengthwise bank 14 having the defect portion 3 is located.

As illustrated in FIG. 16B, without forming the dams 5 around the lengthwise bank 14 having the defect portion 3, the red ink and the green ink mix via the defect portion 3 and produce color mixture regions spreading in the respective ink layers 15a. These color mixture regions each extend long in the Y direction to have a length of around 1 cm.

Once the manufacturing of the display panel 100 is completed, these color mixture regions emit light having colors different from the originally intended colors. Specifically, as already described above, a color mixture region produced through mixing of red ink and green ink emits light with the color red dominant over the color green. Accordingly, a color mixture region formed in a region intended to emit green light turns out to be dominated by the color red. Thus, when such a color mixture region is formed, light-emission color failure occurs, which may result in display failure.

In comparison with this, in this embodiment, a pair of dams 5 is formed around the lengthwise bank 14 having the defect portion 3. The dams 5 partition a concave space 20 into a first space SA, which is between the two dams 5 and is in the vicinity of the defect portion 3, and two second spaces SB, which are outside the dams 5 and are not in the vicinity of the defect portion 3. Thus, the present embodiment confines the color mixture region as described in the following.

FIG. 17 is a cross-sectional diagram taken along line C-C of FIG. 16A, and illustrates a Y-direction cross section of the ink layer 15a (G), which has been formed by applying ink into a concave space 20 in which dams 5 have been formed.

Specifically, an ink layer 15a (G) is formed in the first space SA and in each of the second spaces SB as illustrated in FIG. 17, when inks are applied with respect to the concave spaces 20 between the lengthwise banks 14.

Here, as illustrated in FIG. 16A, the first space SA may become a color mixture region due to red ink and green ink mixing via the defect portion 3. However, the ink layer 15a formed in the first space SA and the ink layers 15a formed in the second areas SB do not mix with one another due to the dams 5 serving as partitions therebetween.

Accordingly, the color mixture region does not spread beyond the dams 5 into the second spaces SB, even if a color mixture region is formed in the first space SA.

As such, in this embodiment, the color mixture region produced by the defect portion 3 is confined within the first space SA, which is a relatively small space in the vicinity of the defect portion 3. Thus, this embodiment has the effect of suppressing the spread of color mixture, and reduces the risk of light-emission color failure of the display panel 100.

Note that the effect achieved by performing repairing with the dams 5 is particularly great when applied to an organic EL display panel having a line bank structure. This is because, when applying inks to concave spaces partitioned by linear lengthwise banks 14 as in this embodiment, a color mixture region that is formed by mixing of inks of different colors is likely to spread and cause light-emission color failure. However, as described later as a modification, the forming of dams 5 achieves a positive effect not only with a line bank structure but also with a pixel bank structure.

Meanwhile, another possible measure for preventing the mixture of inks of different colors due to the presence of a defect portion 3 is repairing the defect portion 3 by covering the defect portion 3 itself with a repair material similar to that described above. However, in order to reliably prevent the mixture of inks of different colors by using such a measure, it is necessary for instance, to cover the entire foreign particle making up the defect portion 3 with the repair material or to repair the collapsed portion making up the defect portion 3 with the repair material. In particular, repairing the defect portion 3 in such a manner by using a dispenser or the like requires performing application while precisely controlling the position of the application needle of the dispenser. Also, when the defect portion 3 is a foreign particle, there are many cases where the defect portion 3 cannot be repaired properly due to the foreign particle repelling the repair material, and thus the application of the repair material is technically difficult. In contrast, with a repair method such as that described in the embodiment in which dams 5 are formed around a lengthwise bank 14 having a defect portion 3, the repair material is not directly applied onto the defect portion 3 but is rather applied so as to surround the defect portion 3. Thus, with such a repair method, the repair material can be applied relatively easily without the risk of the repair material being repelled by the foreign particle.

[Height and Width of Dams 5]

The following is a consideration regarding the height of the dams 5 (i.e., the height of the dams 5 from bottom surfaces of the concave spaces 20).

In the process in Step S9 of FIG. 4 of forming the organic light-emitting layers 15, ink is applied with respect to the first space SA and the second spaces SB. The first space SA is partitioned from the second spaces SB by the dams 5. Thus, an ink layer 15a is formed in the first space SA and in each of the second spaces SB.

The ink layer 15a formed in the first space SA is partitioned from the ink layers 15a formed in the second spaces SB by the dams 5, as illustrated in FIG. 17.

Here, when the dams 5 are too low, the function of the dams 5 of partitioning ink layers 15a from one another is impaired. That is, with dams 5 that are too low, the ink layer 15a in the first space SA mixes with the ink layers 15a in the second spaces SB, and the color mixture region spreads to the second spaces SB. For instance, in the example illustrated in FIG. 16A, if the dams 5 were too low, the green ink layer 15a in the first space SA, having red ink mixed therein, would mix with the green ink layers 15a (G) in the second spaces SB, and the color mixture region containing a mixture of red ink and green ink spreads to the second spaces SB.

Accordingly, it is preferable to set the height of the dams 5 so that the dams 5 sufficiently achieve the function of partitioning the ink layer 15a in the first space SA from the ink layers 15a in the second spaces SB.

Meanwhile, when the dams 5 are too high, the risk increases of tier cutting occurring in the electron transport layer 16 and the common electrode 17 formed above the dams 5.

Based on this consideration, it is preferable to set the height of the dams 5 to be no smaller than 50% and no greater than 200% of the height of the lengthwise banks 14, and to set the height of the dams 5 to be similar to the height of the widthwise banks 24.

Further, it is preferable that the width of the dams 5, or more specifically, the width of the dams 5 in a direction perpendicular to the dam forming lines (the Y direction), is set to no greater than 50 μm. This is because dams 5 that are too wide pose a risk of the dams 5 themselves being noticeable when the display panel 100 is viewed.

[Modification of Forming Dam 5 on Widthwise Bank 24]

In the examples illustrated in FIG. 15A and FIG. 15B, the dams 5A and 5B are formed at different sides of the defect portion 3 in the Y direction, between the widthwise banks 24A and 24B.

Forming the dams 5A and 5B between the widthwise banks 24A and 24B is preferable to suppress color mixture region size. However, as already described above, there is a risk of ink unwetting occurring at the gap between the widthwise bank 24A and the dam 5A and at the gap between the widthwise bank 24B and the dam 5B. In view of this, forming dams as described in the following modification is also effective.

FIG. 18A and FIG. 18B illustrate modifications where some or all of the dams 5 are formed on widthwise banks 24 in plan view.

In the modification illustrated in FIG. 18A, among the dams 5A and 5B disposed at both sides of the defect portion 3 in the Y direction, the dam 5A is formed on the widthwise bank 24A.

By forming the dam 5A on the widthwise bank 24A in such a manner, the distance $L_1$ between the dams 5A and 5B becomes greater compared to in the example illustrated in FIG. 15B. Due to this, it becomes easier to ensure that there is an ink dropping point in the first space between the dams 5A and 5B.

Accordingly, forming the dam 5A on the widthwise bank 24A is efficient for preventing ink unwetting in the first space between the dams 5A and 5B.

Further, while there is a gap between the dam 5A and the widthwise bank 24A in the example illustrated in FIG. 15B, there is no such gap between the dam 5A and the widthwise bank 24A in the example illustrated in FIG. 18A. Thus, forming the dam 5A on the widthwise bank 24A also reduces the risk of ink unwetting occurring in this way.

Further, forming the dam 5A on the widthwise bank 24A is particularly effective when the defect portion 3 is located near the widthwise bank 24A.

In addition, forming the dam 5A on the widthwise bank 24A as described above has the following effect. That is, when forming the dam 5A on the widthwise bank 24A, the widthwise bank 24A exists near the bottom of the dam 5A. Due to this, even when ink unwetting occurs near the bottom of the dam 5A, problems such as short circuiting between the hole injection layer 13 and the common electrode 17 and current leakage do not occur at this area of the display panel 100 that is manufactured.

In particular, the risk of ink unwetting is high near an edge portion of the dam 5A (a portion of the dam 5A that is in contact with a lengthwise bank 14). However, when forming the dam 5A on the widthwise bank 24A as described in this modification, the widthwise bank 24A exists at the edge portion of the dam 5A. Thus, even if ink unwetting occurs at the edge portion of the dam 5A, problems such as short-circuiting and current leakage can be prevented from occurring.

Meanwhile, in the example illustrated in FIG. 18A, there also is a gap between the dam 5B and the widthwise bank 24B. Thus, it is preferable to prevent the occurrence of ink unwetting at this gap by setting the length $L_3$ of the gap to be longer than the distance $W_3$ between the widthwise bank 24B and the ink dropping point nearest the widthwise bank 24B.

In the modification illustrated in FIG. 18B, the dams 5A and 5B disposed at different sides of the defect portion 3 in the Y direction are both formed on widthwise banks 24. Specifically, the dam 5A is formed on the widthwise bank 24A, and the dam 5B is formed on the widthwise bank 24B.

In this case, the distance $L_1$ between the dams 5A and 5B becomes even greater, and becomes equal to the Y-direction length of a sub-pixel. Due to this, it is certainly ensured that ink is dropped in the first space SA between the dams 5A and 5B.

Further, in addition to there being no gap between the dam 5A and the widthwise bank 24A, there is no gap between the dam 5B and the widthwise bank 24B. Further, since the widthwise bank 24B exists near the bottom of the dam 5B, the risk of current leakage occurring is low even if ink unwetting occurs near the bottom of the dam 5B.

As such, the modification illustrated in FIG. 18B achieves an even higher effect of suppressing display failure brought about by ink unwetting.

Embodiment 2

The structure and the manufacturing method of the display panel 100 pertaining to embodiment 2 are similar to those described in embodiment 1.

Also, embodiment 2 is similar to embodiment 1 in that dams 5 are formed in adjacent concave spaces 20 between which a lengthwise bank 14a having a defect portion 3 is located. However, embodiment 2 differs from embodiment 1 in terms of the shape of the dams 5 that are formed.

FIG. 19A is a perspective view illustrating the shape of the dams 5 pertaining to embodiment 2. FIG. 19B is a plan view illustrating a state where ink layers have been formed after the dams 5 have been formed in concave spaces. FIG. 19C is a plan view illustrating ink dropping points in a concave space in which a dam 5 has been formed.

The dams 5 pertaining to this embodiment have the shape illustrated in FIG. 19B. Specifically, in plan view of an X-Y plane, each dam 5 is formed to have an L shape, extending from one (point $A_1$) to the other (point $A_2$) of two points (point $A_1$ and point $A_2$) set at different sides of the defect portion 3 in the Y direction while detouring around the defect portion 3. Further, each dam 5 comes in contact with a lengthwise bank 14 adjacent to the lengthwise bank 14a having the defect portion 3 at point $A_3$ located at some point along the path between point $A_1$ and point $A_2$.

The dams 5 can be formed by using a method similar to the method described in embodiment 1 with reference to FIG. 12A through FIG. 12G. Specifically, each dam 5 is formed by applying repair material with respect to a plurality of application points set along a dam forming line that extends from point $A_1$ to point $A_2$ via point $A_3$, one after another.

By disposing the dams 5 in adjacent concave spaces 20 between which the lengthwise bank 14 having the defect portion 3 is located as described above, each concave space 20 is partitioned by one dam 5 into a first space SA in the vicinity of the defect portion 3, and two second spaces SB not in the vicinity of the defect portion 3, as illustrated in FIG. 19A. Accordingly, the defect portion 3 is surrounded by two first spaces SA.

Accordingly, embodiment 2 achieves the effect of suppressing color mixture, as embodiment 1 does.

Specifically, as illustrated in FIG. 19B, even if a color mixture region is formed by red ink and green ink mixing via the defect portion 3 when inks for forming light-emitting layers are applied in the concave spaces 20 between the lengthwise banks 14, the color mixture region does not spread beyond the dam 5 into the second spaces SB. As such, the color mixture region produced by the defect portion 3 is confined within the first space SA, which is a relatively small space in the vicinity of the defect portion 3. Thus, the risk of light-emission color failure in the display panel 100 can be reduced.

Further, embodiment 2 is similar to embodiment 1 in that the repair can be performed easily because the dams 5 are formed by applying the repair material so as to surround the defect portion 3.

Meanwhile, the dams 5 in embodiment 2 form first areas SA occupying a smaller surface area than the first areas SA formed by the dams 5 in embodiment 1. Thus, embodiment 2 further suppresses the occurrence of light-emission color failure in the display panel 100.

Further, as with the dams 5 pertaining to embodiment 1, it is preferable to set the shape of the dams 5 pertaining to embodiment 2 such that in a concave space 20 in which a dam 5 is formed, it is ensured that there is an ink dropping point in the space enclosed by the dam 5 (i.e., the first space SA) and gaps between the dam 5 and the widthwise banks 24.

The following describes this point in detail with reference to FIG. 19C.

Note that the following description is provided assuming that the nozzle head 322 is moved from the standard position, similar to in embodiment 1.

For the sake of explanation, the following description is provided by dividing an L-shaped dam 5 into two dam portions at point $A_3$, and referring to the dam portion that is located near the widthwise bank 24A as a dam portion 5A while referring to the dam portion that is located near the widthwise bank 24B as a dam portion 5B.

The basic condition that needs to be satisfied in order to ensure that there is an ink dropping point in the first space SA between the dams portions 5A and 5B is that, in the space enclosed by the dam 5 (i.e., the first space SA), at least one of the ink dropping lines $Q_1$ and $Q_2$ has a length greater than the pitch $W_1$ of the ink dropping points. This is similar to embodiment 1.

Here, it should be noted that the dam portions 5A and 5B of a dam 5 pertaining to this embodiment are inclined with respect to the X direction. Due to this, the distance between the two points at which the ink dropping line $Q_1$ intersects with the dam 5 (the distance between dam portions 5A and 5B along the ink dropping line $Q_1$) is greater than the distance between the two points at which the ink dropping line $Q_2$ intersects with the dam 5 (the distance between dam portions 5A and 5B along the ink dropping line $Q_2$).

Taking this into configuration, it can be basically ensured that there is an ink dropping point in the first space SA between the dam portions 5A and 5B by setting the positions where the dams portions 5A and 5B are formed such that a distance $L_{11}$ between the two points at which the ink dropping line $Q_1$ intersects with the dam 5 is greater than the pitch $W_1$ of ink dropping lines (i.e., so that $L_{11}>W_1$ is satisfied).

Typically, the ink dropping point pitch $W_1$ is 20 μm or greater. Thus, in order to ensure that there is an ink dropping point in the first space SA between the dam portions 5A and 5B, it can also be said that it is preferable to set the distance $L_{11}$ between the dam portions 5A and 5B to be greater than 20 μm.

The following considers a suitable condition for ensuring that there is an ink dropping point in the gap between the dam portion 5A and the widthwise bank 24A. This condition is basically the same as that in embodiment 1. That is, it suffices to make a configuration so that in the gap between the dam portion 5A and the widthwise bank 24A, at least one of the ink dropping lines $Q_1$ and $Q_2$ has a length greater than a distance $W_2$ between the widthwise bank 24A and an ink dropping point nearest the widthwise bank 24A.

Here, it should be noted that in the gap between the dam portion 5A and the widthwise bank 24A, the length $L_{22}$ of the ink dropping line $Q_2$ is greater than the length $L_{21}$ of the ink dropping line $Q_1$. Taking this into consideration, it suffices to make a configuration so that the length $L_{22}$ of the ink dropping line $Q_2$ in the gap between the dam portion 5A and the widthwise bank 24A is greater than the distance $W_2$ between the widthwise bank 24A and an ink dropping point nearest the widthwise bank 24A (i.e., so that $L_{22}>W_2$ is satisfied).

Accordingly, it can be said that it is preferable to make a configuration so that the length $L_{22}$ of the ink dropping line $Q_2$ in the gap between the widthwise bank 24A and the dam portion 5A is greater than 20 μm (i.e., so that $L_{22}>20$ μm is satisfied).

Further, the condition for ensuring that there is an ink dropping point in the gap between the dam portion 5B and the widthwise bank 24B is similar to the above-described condition for ensuring that there is an ink dropping point in the gap between the dam portion 5A and the widthwise bank 24A. Specifically, it suffices to make a configuration so that in the gap between the dam portion 5B and the widthwise bank 24B, at least one of the ink dropping lines $Q_1$ and $Q_2$ has a length greater than a distance $W_3$ between the widthwise bank 24B and an ink dropping point nearest the widthwise bank 24B.

Here, it should be noted that in the gap between the dam portion 5B and the widthwise bank 24B, the length $L_{32}$ of the ink dropping line $Q_2$ is greater than the length $L_{31}$ of the ink dropping line $Q_1$. Taking this into consideration, it suffices to make a configuration so that $L_{32}>W_3$ is satisfied.

Accordingly, it can be said that it is preferable to make a configuration so that the length $L_{32}$ of the ink dropping line $Q_2$ in the gap between the widthwise bank 24B and the dam portion 5B is greater than 20 μm (i.e., so that $L_{32}>20$ μm is satisfied).

In the example illustrated in FIG. 19C, the defect portion 3 close to being located in between the widthwise bank 24A and the widthwise bank 24B in the Y direction, and thus, the dams 5 that are formed around the defect portion 3 are also formed between the widthwise bank 24A and the widthwise bank 24B. However, for example, when the defect portion 3 is located near the widthwise bank 24A, the dam portion 5A may be partially or entirely formed on the widthwise bank 24A. By forming the dam portion 5A on the widthwise bank 24A, the effect of preventing ink unwetting can be achieved, as described in embodiment 1.

Embodiment 3

The structure and the manufacturing method of the display panel 100 pertaining to embodiment 3 are similar to those described in embodiment 1.

Also, embodiment 3 is similar to embodiment 1 in that the defect portion 3 is repaired by forming dams 5 in concave spaces 20 adjacent to a lengthwise bank 14a having the defect portion 3. Meanwhile, embodiment 3 differs from embodiment 1 in terms of the shape of the dams 5 that are formed.

FIG. 20A is a perspective view illustrating the shape of the dams 5 pertaining to embodiment 3. FIG. 20B is a plan view illustrating a state where ink layers 15a have been formed after the dams 5 have been formed in concave spaces 20. FIG. 20C is a schematic illustrating ink dropping points in a concave space in which a dam 5 has been formed.

The dams 5 pertaining to this embodiment have the shape illustrated in FIG. 20B. Similar to embodiment 2, in plan view of an X-Y plane, each dam 5 extends from one point (point $A_1$) to the other (point $A_2$) of two points (point $A_1$ and point $A_2$) set at different sides of the defect portion 3 in the Y direction while detouring around the defect portion 3. However, this embodiment differs from embodiment 2 in that each dam 5 does not come in contact with a lengthwise banks 14 adjacent to the lengthwise bank 14a having the defect portion 3. In other words, each dam 5 in this embodiment is such that a maximum X-direction distance b between the dam 5 and the center of the defect portion 3 is set to be smaller than the width (X-direction width) of a concave space 20.

Further, each dam 5 in this embodiment has a C shape, as illustrated in FIG. 20A through FIG. 20C.

The dams 5 in this embodiment can also be formed by using a method similar to the method described in embodiment 1 with reference to FIG. 12A through FIG. 12G. Specifically, each dam 5 is formed by applying repair material with respect to a plurality of application points set along a dam forming line that extends from point $A_1$ to point $A_2$, one after another.

By disposing the dams 5 in adjacent concave spaces 20 between which the lengthwise bank 14 having the defect portion 3 is located as described above, each concave space 20 is partitioned by one dam 5 into a first space SA in the vicinity of the defect portion 3, and a second space SB not in the vicinity of the defect portion 3, as illustrated in FIG. 20A. Accordingly, embodiment 3 achieves the effect of confining the color mixture region, similar to embodiment 1.

Specifically, as illustrated in FIG. 20B, even if a color mixture region is formed by red ink and green ink mixing via a defect portion 3 when inks for forming light-emitting layers are applied in the concave spaces 20 between lengthwise banks 14, the color mixture region does not spread beyond the dam 5 into the second space SB.

Further, embodiment 3 is similar to embodiment 1 in that the repair can be performed easily because the dams 5 are formed by applying the repair material so as to surround the defect portion 3, and in that no current leakage occurs in the regions between the dams 5 in the display panel 100 that is manufactured.

Meanwhile, the dams 5 in this embodiment form first areas SA occupying an even smaller area than the first areas SA formed by the dams 5 in embodiments 1 and 2. Thus, this embodiment further suppresses the occurrence of light-emission color failure in the display panel 100.

Further, as with the dams 5 pertaining to embodiments 1 and 2, it is preferable to set the shape of the dams 5 pertaining to this embodiment such that in a concave space 20 in which a dam 5 is formed, it is ensured that there is an ink dropping point in the space enclosed by the dam 5 (i.e., the first space SA).

The following describes this point in detail with reference to FIG. 20C.

Note that the following description is provided assuming that the nozzle head 322 is moved from the standard position, similar to in embodiments 1 and 2.

For the sake of explanation, the following description is provided by dividing a C-shaped dam 5 into three dam portions, specifically a dam portion 5A that is located near the widthwise bank 24A, a dam portion 5B that is located near the widthwise bank 24B, and a dam portion 5C that connects the dam portion 5A and the dam portion 5B.

In order for an ink dropping point to exist in the space enclosed by a dam 5 (i.e., the first space SA), firstly, it is necessary for at least one of the ink dropping lines $Q_1$ and $Q_2$ to pass through the first space SA, traversing the dam portions 5A and 5B. That is, it is necessary to make a configuration so that at least one of the ink dropping lines $Q_1$ and $Q_2$ is such that the distance between the ink dropping line and the lengthwise bank 14 having the defect portion 3 is smaller than a separation distance $D_1$ between the lengthwise bank 14 and a portion of the dam 5 that is farthest from the lengthwise bank 14 (i.e., the X-direction distance between the lengthwise bank 14 having the defect portion 3 and the dam portion 5C).

Further, in order to ensure that there is an ink dropping point between the dam portions 5A and 5B (in the first space SA), it is preferable to set the Y-direction positions where the dam portions 5A and 5B are formed so that for at least one of the ink dropping lines $Q_1$ and $Q_2$, a distance between the two points at which the ink dropping line traverses the dam 5 is greater than the pitch $W_1$ of ink dropping points. It can be ensured that there is an ink dropping point between the dam portions 5A and 5B by making such a configuration.

In the example illustrated in FIG. 20C, a configuration is made so that the distance $D_2$ between the ink dropping line $Q_1$ and the lengthwise bank 14 having the defect portion 3 is smaller than the separation distance $D_1$ (i.e., so that $D_2<D_1$ is satisfied). Thus, the ink dropping line $Q_1$ passes through the first space SA, intersecting the dam 5 at two points (i.e., intersecting each of the dam portions 5A and 5B).

Accordingly, in order to ensure that there is an ink dropping point between the dam portions 5A and 5B, it suffices to set the Y-direction positions where the dam portions 5A and 5B are formed so that a length $L_1$ of the ink dropping line $Q_1$ in the first space SA (i.e., the distance between the dam portions 5A and 5B, which face one another in the Y direction) is greater than the pitch $W_1$ of the ink dropping points (so that $L_1>W_1$ is satisfied).

Further, considering that typically the distance between a lengthwise bank 14 and an ink dropping line is around 10 μm, it can be said it is preferable to make a configuration so that $D_1>10$ μm be satisfied. Further, because the ink dropping point pitch $W_1$ is typically 20 μm or greater, it can be said that it is preferable to set the distance $L_1$ between the dam portions 5A and 5B to be greater than 20 μm.

In addition, similar to the above, when there is a gap between a dam 5 and a widthwise bank 24 adjacent to the dam 5, it is preferable dropping ink into the gap to prevent ink unwetting at the gap.

For example, when there is a gap between the dam portion 5A and the widthwise bank 24A and there is a gap between the dam portion 5B and the widthwise bank 24B, as in the example illustrated in FIG. 20C, it is preferable to ensure that ink is dropped into each of such gaps.

The condition that needs to be satisfied to ensure that there is an ink dropping point between the dam portion 5A and the widthwise bank 24A is similar to that described in embodiment 1. Specifically, it suffices to make a configuration so that in the gap between the dam portion 5A and the widthwise bank 24A, at least one of the ink dropping lines $Q_1$ and $Q_2$ has a length greater than a distance $W_2$ between the widthwise bank 24A and an ink dropping point nearest the widthwise bank 24A.

In the example illustrated in FIG. 20C, the ink dropping lines $Q_1$ and $Q_2$ both have a same length $L_2$ in the gap between the dam portion 5A and the widthwise bank 24A. Thus, it suffices to set the position where the dam portion 5A is to be formed so that $L_2>W_2$ is satisfied.

The above similarly applies to the gap between the dam portion 5B and the widthwise bank 24B. That is, it suffices to set the position where the dam portion 5A is to be formed so that in the gap between the dam portion 5B and the widthwise bank 24B, at least one of the ink dropping lines $Q_1$ and $Q_2$ has a length $L_3$ greater than a distance $W_3$ between the widthwise bank 24B and an ink dropping point nearest the widthwise bank 24B (i.e., so that $L_3>W_3$ is satisfied).

Similar to in the example illustrated in FIG. 19C, in the example illustrated in FIG. 20C, the defect portion 3 is close to being located in between the widthwise bank 24A and the widthwise bank 24B in the Y direction, and thus, the dams 5 that are formed around the defect portion 3 are also formed between the widthwise bank 24A and the widthwise bank 24B. However, a dam 5 may be partially or entirely formed on the widthwise bank 24A. For example, when the defect portion 3 is located near the widthwise bank 24A, the dam portion 5A may be formed on the widthwise bank 24A, or the dam portion 5A and the dam portion 5C may be formed on the widthwise bank 24A.

Embodiment 4

In embodiments 1 through 3, the shapes of the dams 5 that are formed in the dam forming process are set so that there are ink dropping points in the areas (i.e., the first spaces SA) enclosed by the dams 5.

Meanwhile, in this embodiment, the Y-direction position of the nozzle head 322 is adjusted in applying ink in the concave spaces 20 by using the inkjet device in the light-emitting layer forming process so that there are ink dropping points in the areas (i.e., the first spaces SA) enclosed by the dams 5.

FIG. 21A and FIG. 21B illustrate the ink application method pertaining to this embodiment. FIG. 21A illustrates a case where the Y-direction position of the nozzle head 322 is set to the standard position, and FIG. 21B illustrates a case where the Y-direction position of the nozzle head 322 has been adjusted. Note that in each of these drawings, the dash-dotted lines each indicate a line along which a nozzle 325 moves (referred to in the following as a nozzle scanning line of a nozzle 325). Note that for simplicity, four ink dropping points are illustrated between the widthwise bank 24A and the widthwise bank 24B along each of the two ink dropping lines $Q_1$ and $Q_2$ in FIG. 21A and FIG. 21B.

Further, the dams 5 are formed in a lattice structure, surrounding the lengthwise bank 14 having the defect portion 3. This is similar to embodiment 1. Further, ink is dropped into the concave spaces 20 by causing the nozzles 325 to eject ink while moving the nozzle head 322 in the X direction. This is also similar to embodiment 1.

Meanwhile, it should be noted that description in this embodiment is based on a situation where dams 5A and 5B have been formed around a defect portion 3 detected over the ground substrate 11, and the distance $L_1$ between the dams 5A and 5B is smaller than the pitch $W_1$ of ink dropping points.

When the distance $L_1$ between the dams 5A and 5B formed around a defect portion 3 is smaller than $W_1$, as illustrated in FIG. 21A, there is a risk of none of the scanning lines of the nozzles 325 passing over the first space SA enclosed by the dams 5A and 5B should the nozzle head 322 be moved in the X direction with the Y-direction position of the nozzle head 322 set to the standard position in the inkjet device 300.

In view of this, in this embodiment, the nozzle head 322 is moved in the X direction for ink application into the concave spaces 20 over the ground substrate 11 with the inkjet device 300 after, if necessary, shifting the Y-direction position of the nozzle head 322, as illustrated in FIG. 21B. Further, in this embodiment, the amount of this Y-direction shift is set so that a nozzle scanning line passes over each first space SA.

The following describes the details of the ink application method pertaining to this embodiment.

FIG. 22 is a flowchart illustrating one specific example of the process of applying ink with the inkjet device 300. In FIG. 22, n indicates identification numbers provided to the defect portions 3 having been detected over the ground substrate 11. Further, the processing executed in Steps S51 through S61 is a specific example of how the shift amount $\Delta W$ of the nozzle head 322 is set.

First, for the first defect portion 3 (Step S51), Y-direction positions $S_1$ and $S_2$ of the respective dams 5A and 5B formed for the defect portion 3, relative to a reference $S_0$ set in the sub-pixel corresponding to the defect portion 3, are calculated. For example, as illustrated in FIG. 21A, an edge of the widthwise bank 24B corresponding to the defect portion 3 is set as the reference $S_0$, and the Y-direction positions $S_1$ and $S_2$ relative to this reference $S_0$ are calculated. Here, because the Y-direction positions of the two dam forming lines (refer to FIG. 11A and FIG. 11B) having been set by the repair device 200 in the dam forming process described in embodiment 1 are already known, the Y-direction positions $S_1$ and $S_2$ of the dams 5A and 5B can be acquired by expressing the Y-direction positions of the two dam forming lines based on the reference $S_0$ (Step S52).

Subsequently, by using the Y-direction positions $S_1$ and $S_2$ and a value T indicating the thickness of the dams 5A and 5B, the Y-direction range of the first space SA relative to the reference $S_0$ is calculated. Here, the first space SA can be expressed as extending from $(S_2-T/2)$ to $(S_1+T/2)$ (Step S53).

Then, the Y-direction range of the first space SA is calculated for each of the second and following defect portions 3 (NO in Step S54, Step S55, and Steps S52 and S53). When the Y-direction range of the first space SA has been calculated for every defect portion 3 (YES in Step S54), the shift amount $\Delta W$ is calculated through the subsequent Steps S56 through S62.

In Step S56, the Y-direction position of each nozzle scanning line when the nozzle head 322 is located at the standard position in the Y direction is calculated (i.e., standard Y-direction positions $Y_1$, $Y_2$, $Y_3$, and $Y_4$ of the nozzle scanning lines relative to the reference $S_0$, are calculated).

The standard positions $Y_1$, $Y_2$, $Y_3$, and $Y_4$ can be calculated, for example, based on the Y-direction length of sub-pixels and the ink dropping point pitch (i.e., the nozzle pitch) $W_1$. Specifically, the Y-direction positions $Y_1$, $Y_2$, $Y_3$, and $Y_4$ relative to the reference $S_0$ are respectively calculated as $Y_1=0.5(L_0-3\ W_1)$, $Y_2=0.5(L_0-W_1)$, $Y_3=0.5(L_0+W_1)$, and $Y_4=0.5(L_0+3\ W_1)$, where $L_0$ denotes the Y-direction length of sub-pixels (i.e., the distance between the widthwise bank 24A and the widthwise bank 24B) and $W_1$ denotes the nozzle pitch, as illustrated in FIG. 21A.

Subsequently, after setting zero to a counter m (Step S57), an examination is performed in Step S58 of whether there is a first space SA, among first spaces SA for all defect portions 3 that have already been calculated, which none of the nozzle scanning lines pass over when the nozzle scanning lines are located at the standard positions $Y_1$, $Y_2$, $Y_3$, and $Y_4$.

For example, this judgment is performed as follows. First, a judgment is performed of whether or not one of $Y_1$, $Y_2$, $Y_3$, and $Y_4$ is located within the range (from $(S_2-T/2)$ to $(S_1+T/2)$) of the first space SA corresponding to the first defect portion 3. If yes, the same judgment is performed for the second defect portion 3. When a judgment is made for every one of the first through last defect portions 3 that one of $Y_1$, $Y_2$, $Y_3$, and $Y_4$ is located within the range of the corresponding first space SA, a judgment is made that there is no first space SA which none of the nozzle scanning lines pass over.

Otherwise, a judgment is made that there is a first space SA which none of the nozzle scanning lines pass over.

When a judgment is made that there is no first space SA which none of the nozzle scanning lines pass over (NO in Step S59), the shift amount ΔW is set to zero in Step S60. Then, an operator inputs this shift amount ΔW=0 to the input means 333 of the inkjet device 300. As a result, the Y-direction position of the nozzle head 322 is set to the standard position in the inkjet device 300, and the nozzle head 322 ejects ink while moving in the X-direction from the standard position in the Y direction (Step S61).

Meanwhile, when a judgment is made that there is a first space SA which none of the nozzle scanning lines pass over (YES in Step S59), the Y-direction positions of the nozzle scanning lines are shifted slightly and the judgement of whether or not there is a first space SA which none of the nozzle scanning lines pass over is performed again.

Specifically, after the counter m is incremented by one (Steps S62 and S63), the Y-direction positions of the respective nozzle scanning lines are shifted from the respective standard position ($Y_1, Y_2, Y_3$, and $Y_4$) by one tenth of the ink dropping pitch $W_1$ in either the positive direction or the negative direction, and a judgment is performed of whether there is a first space SA which none of the nozzle scanning lines pass over after the shift (Step S58).

The judgement performed after the nozzle scanning lines are shifted from the respective standard positions by one tenth of the ink dropping pitch $W_1$ in either the positive direction or the negative direction (i.e., the judgment performed in Step S58 when m=1) is similar to the judgment described above performed when m=0. Specifically, when the shifting is performed in the positive direction, a judgment is made of whether one of $Y_1+0.1W_1$, $Y_{2+0.1}W_1$, $Y_{3+0.1}W_1$, and $Y_{4+0.1}W_1$ is located within the range (from $(S_2-T/2)$ to $(S_1+T/2)$) of the first space SA corresponding to the first defect portion 3. If yes, the same judgment is performed for the second defect portion 3. Thus, it can be examined whether there is a first space SA which none of the nozzle scanning lines pass over after the shift by one tenth of the ink dropping pitch $W_1$.

When a judgment is made that there is no first space SA which none of the nozzle scanning lines pass over after shifting the Y-direction positions of the nozzle scanning lines by one tenth of the ink dropping pitch $W_1$ in the positive direction or the negative direction from the respective standard positions ($Y_1, Y_2, Y_3, Y_4$) (NO in Step S59), a shift amount ΔW of $0.1W_1$ or $-0.1W_1$ is determined as being suitable in Step S60. Then, the operator inputs this shift amount ΔW ($0.1W_1$ or $-0.1W_1$) to the input means 333 of the inkjet device 300. As a result, in the inkjet device 300, the Y-direction position of the nozzle head 322 is set to a position that is shifted from the standard position by one tenth of the ink dropping pitch $W_1$ in the positive direction or the negative direction, and the nozzle head 322 ejects ink while moving in the X-direction from this Y-direction position.

Meanwhile, when a judgment is made that there is a first space SA which none of the nozzle scanning lines pass over after shifting the Y-direction positions of the nozzle scanning lines by one tenth of the ink dropping pitch $W_1$ in the positive direction or the negative direction from the respective standard positions ($Y_1, Y_2, Y_3, Y_4$) (YES in Step S59), the counter m is incremented by one once again (thus, m=2) (Step S62). By incrementing the counter m in this way, the shift amount of the ink scanning lines is set to two tenths of the ink dropping pitch $W_1$, and thus the Y-direction positions of the respective nozzle scanning lines are shifted from the respective standard position ($Y_1, Y_2, Y_3$, and $Y_4$) by two tenths of the ink dropping pitch $W_1$ in either the positive direction or the negative direction. Subsequently, a judgment is performed of whether there is a first space SA which none of the nozzle scanning lines pass over after the shift (Steps S58 and S59 for m=2).

When a judgment is made that there is no first space SA which none of the nozzle scanning lines pass over after shifting the Y-direction positions of the nozzle scanning lines by two tenths of the ink dropping pitch $W_1$ in the positive direction or the negative direction from the respective standard positions ($Y_1, Y_2, Y_3, Y_4$) (NO in Step S59 for m=2), a shift amount ΔW of $0.2W_1$ or $-0.2W_1$ is determined as being suitable in Step S60. Then, the operator inputs this shift amount ΔW ($0.2W_1$ or $-0.2W_1$) to the input means 333 of the inkjet device 300.

Meanwhile, when a judgment is made that there is a first space SA which none of the nozzle scanning lines pass over after shifting the Y-direction positions of the nozzle scanning lines by two tenths of the ink dropping pitch $W_1$ in the positive direction or the negative direction from the respective standard positions ($Y_1, Y_2, Y_3, Y_4$) (YES in Step S59), the shift amount of the nozzle scanning lines is increased to three thirds of the ink dropping pitch $W_1$, and judgment and processing are performed in a similar manner as described above.

As such, through Steps S58, S59, S62, and S63, the examination of whether there is a nozzle scanning line passing over the first space SA is performed for the first spaces SA for all defect portions 3 one after another while increasing the shift amount by one tenth of the ink dropping pitch $W_1$ each time, and the shift amount when the judgment is made that there is no first space which none of the nozzle scanning lines pass over is set as the shift amount ΔW.

By calculating the shift amount ΔW in such a manner, it is ensured that a shift amount with the smallest absolute value is selected as the shift amount ΔW, even when there are multiple shift amounts satisfying the condition for ensuring that there is no first space SA which none of the nozzle scanning lines pass over.

This is preferable to avoid the risk of an ink dropping point being set over a widthwise bank 24, because selection of a shift amount ΔW with a great absolute value may result in an ink dropping point being set over a widthwise bank 24.

In addition, if there still is a first space SA which no nozzle scanning line passes over after incrementing the counter m to nine and increasing the shift amount to nine tenths of the ink dropping pitch $W_1$ (YES in Step S63), a judgment is made that there is no shift amount ensuring that a nozzle scanning line passes over every first space SA (judgment result "No Good"). In such a case, ink application with respect to the current ground substrate 11 is cancelled.

As such, in this embodiment, the nozzle head 322 is moved in the X direction for ink application with the inkjet device 300 after adjusting the Y-direction position of the nozzle head 322 as illustrated in FIG. 21B. As a result, the forming of light-emitting layers 15 is performed with it being ensured that there is an ink dropping point in every first space SA over the ground substrate 11, and thus, that ink is applied to every first space SA.

The present embodiment describes ensuring that an ink dropping point exists in every first space SA by adjusting the position of the nozzle head 322 in the inkjet device 300, based on a case where dams 5 forming a lattice structure. However, the adjustment of the Y-direction position of the nozzle head 322 ensures that there is an ink dropping point in every first space SA, even if applied to dams 5 not forming a lattice structure and instead having the shapes described in embodiments 2 and 3.

Further, in the above, description is provided that the operator calculates and inputs the shift amount ΔW to the inkjet device 300. However, the processing in Steps S51 through S63 may be performed automatically by the inkjet device 300.

<Modifications>

1. Embodiments 1 through 4 provide description based on a case where both the lengthwise banks 14 and the widthwise banks 24 are formed over the ground substrate 11. However, the present invention is also applicable to a case where the widthwise banks 24 are not formed, in which case light-emission failure in a display device can also be suppressed by repairing a defect portion of a lengthwise bank 14 by forming dams and forming light-emitting layers through a wet process.

2. Embodiments 1 through 4 describe that, in each concave space 20, a plurality of ink dropping points are set along each of two ink dropping lines $Q_1$ and $Q_2$ extending in the Y direction. However, the present invention can be similarly implemented when a configuration is made so that only one ink dropping line passes over each concave space or three or more ink dropping line pass over each concave space.

Further, when a configuration is made so that only one ink dropping line passes through each concave space 20, the ink dropping line is typically set along the center of each concave space 20 in the width direction (i.e., the center in the X direction). As such, when making such a configuration, the conditions to be satisfied to ensure that there is an ink dropping point in the first space can be configured by setting conditions related to the lengths $L_1$, $L_2$, and $L_3$ along the center line through each concave space 20.

3. In the examples illustrated in FIG. 6B, FIG. 15A, FIG. 15B, FIG. 19A, FIG. 19B, FIG. 20A, and FIG. 20B referred to in embodiments 1 through 4, the dams 5 formed in concave spaces 20 between which the lengthwise bank 14 having the defect portion 3 is located are formed to have line symmetry with respect to the lengthwise bank 14 having the defect portion 3. However, dams 5 formed in concave spaces 20 between which a lengthwise bank 14 having a defect portion 3 is located need not have symmetry.

For example, FIG. 6B and FIG. 11A pertaining to embodiment 1 each illustrate two dams 5 extending in the X direction along one same line passing through point $A_1$ and two other dams 5 extending in the X direction along one same line passing through point $A_2$. However, each dam may extend in the X direction along a different line.

Further, FIG. 19B pertaining to embodiment 2 and FIG. 20B pertaining to embodiment 3 each illustrate two dams 5 each extending from point $A_1$ to point $A_2$. However, the two dams 5 may connect different pairs of points.

Further, in FIG. 20B pertaining to embodiment 3, the maximum X-direction distance b from the lengthwise bank 14 having the defect portion 3 is the same for the two dams 5. However, the maximum X-direction distance b from the lengthwise bank 14 having the defect portion 3 may differ between the two dams 5.

4. Embodiments 1 through 4 provide description based on a case where a defect portion of a lengthwise bank is repaired in a structure where linear lengthwise banks and widthwise banks that have smaller height than the lengthwise banks are formed over a substrate. However, the present invention can be similarly implemented for repairing a defect portion in a pixel bank structure where lengthwise banks 14 extending in the Y direction and widthwise banks 24 extending in the X direction have similar height.

FIG. 23A through FIG. 23D each illustrate an example of repairing a defect portion in a display panel having a pixel bank structure.

Specifically, in each of FIG. 23A through FIG. 23D, a pixel bank structure is formed by lengthwise banks 14 extending in the Y direction and widthwise banks 24 extending in the X direction having similar height, and organic EL elements are formed in rectangular regions surrounded by the lengthwise banks 14 and the widthwise banks 24.

In each example, one or more dams 5 are formed in each of adjacent concave spaces 20 between which a lengthwise bank 14 having a defect portion 3 is located, and each dam 5 partitions the concave space 20 in which it is formed into a space in the vicinity of the defect portion 3 and a space not in the vicinity of the defect portion 3.

In FIG. 23A, a pair of dams 5 is formed in each of the two concave spaces 20 between which the lengthwise bank 14 having the defect portion 3 is located. The two dams 5 in each concave space 20 extend from respective points $A_1$ and $A_2$ to an opposite lengthwise bank 14. This is similar to embodiment 1.

In this example as well, even if a color mixture region is formed upon ink application due to the presence of the defect portion 3, the color mixture region is confined to be within the region between the two dams 5. As such, the effect of suppressing light-emission color failure is achieved.

In FIG. 23B, a dam 5 is formed in each of the two concave spaces 20 between which the lengthwise bank 14 having the defect portion 3 is located. The dam 5 in each concave space 20 extends from point $A_1$ to point $A_2$, detouring around the defect portion 3. This is similar to embodiment 2.

In this example as well, even if a color mixture region is formed upon ink application due to the presence of the defect portion 3, the color mixture region is confined to be within the region surrounded by the dam 5. As such, the effect of suppressing light-emission color failure is achieved.

Also, although not depicted in the drawings, the dams 5 of embodiment 3 are also applicable to the pixel bank structure, in which case the effect of suppressing light-emission color failure is similarly achieved.

In FIG. 23C, a lengthwise bank 14 has a defect portion 3 that is near a widthwise bank 24. Further, a dam 5 is formed in each of the two concave spaces 20 between which the lengthwise bank 14 having the defect portion 3 is located. The dam 5 in each concave space 20 extends from point $A_1$ to the widthwise bank 24 that is near the defect portion 3, detouring around the defect portion 3.

In this example as well, even if a color mixture region is formed upon ink application due to the presence of the defect portion 3, the color mixture region is confined to be within the region surrounded by the two dams 5 and the widthwise bank 24. As such, the effect of suppressing light-emission color failure is achieved.

In FIG. 23D, a defect portion 3 is present where a lengthwise bank 14 and a widthwise bank 24 intersect, and the defect portion 3 faces four concave spaces 20.

Further, a dam 5 is formed in each of these four concave spaces 20. Specifically, two of the four dams 5 are formed each extending from point $A_1$ to the widthwise bank 24 while detouring around the defect portion 3, and the two other dams 5 are formed each extending from point $A_2$ to the widthwise bank 24 while detouring around the defect portion 3.

In this example, there is a risk of color mixture occurring between the four concave spaces 20 upon ink application due to the presence of the defect portion 3. However, even if such color mixture does occur, the color mixture region is confined to be within the region surrounded by the four dams 5. As such, the effect of suppressing light-emission color failure is achieved.

When dams 5 are formed in concave spaces 20 near a defect portion 3 in a pixel bank structure as described above, ensuring that there is an ink dropping point in each of the spaces defined by the dams 5 (first spaces in the vicinity of the defect portion 3 and second spaces not in the vicinity of the defect portion 3) in the forming of light-emitting layers achieves the effect of preventing the occurrence of current leakage at the spaces defined by the dams 5 in the display panel that is manufactured. This is similar to when dams are formed in a line bank structure.

5. The embodiments describe dropping ink into both a first space and a second space partitioned by a dam in the forming of light-emitting layers. Similar effects can be achieved by dropping ink into both a first space and a second space partitioned by a dam in the forming of organic functional layers other than light-emitting layers.

For example, when forming a hole transport layer through a wet process between a hole injection layer and a light-emitting layer, ensuring that an inkjet device drops ink for forming the hole transport layer in both the first space and the second space achieves preventing ink unwetting in the first and second spaces and preventing the occurrence of current leakage in the display panel.

6. While the embodiments provide description taking a top-emission-type organic EL panel as an example, the present invention is also applicable to bottom-emission-type organic EL panels.

INDUSTRIAL APPLICABILITY

The present invention is applicable to an organic EL display device used, for example, in various display devices, television devices, portable electronic device displays, and so on used in private homes, public facilities, and for commercial use.

The invention claimed is:

1. A method of manufacturing an organic electroluminescence (EL) display device by forming banks over a substrate and forming an organic functional layer in each of a plurality of concave spaces partitioned from one another by the banks, the method comprising:
    detecting a defect portion of a bank;
    when a bank defect portion is detected, forming, in each of adjacent concave spaces, among the plurality of concave spaces, between which one of the banks having the bank defect portion is located, one or more dams partitioning the concave space into a first space adjacent to the bank defect portion and a second portion not adjacent to the bank defect portion; and
    then forming the organic functional layer in each of the plurality of concave spaces by causing a nozzle head to eject ink into the concave spaces, wherein
    in the forming of the organic functional layer, there is an ink dropping point where the nozzle head ejects the ink in each of the first space and the second space.

2. The method of claim 1 further comprising
    forming lengthwise banks extending in parallel in one direction along a surface of the substrate, the lengthwise banks partitioning the plurality of concave spaces from one another, wherein
    in the forming of the organic functional layer, there are a plurality of ink dropping points along each of one or more ink dropping lines extending in the one direction, in each of the plurality of concave spaces, and
    the one or more dams are provided with a shape such that, in a concave space in which the one or more dams are formed, a length of at least one of the ink dropping lines in the first space is greater than a pitch of ink dropping points along the ink dropping line.

3. The method of claim 1 further comprising:
    forming elongated widthwise banks extending in parallel along a surface of the substrate; and
    forming lengthwise banks extending in parallel in one direction along the surface of the substrate, the lengthwise banks intersecting the widthwise banks and having greater height than the widthwise banks, wherein
    in the forming of the one or more dams, one dam is formed with there being a space between the one dam and a widthwise bank adjacent to the one dam, and
    in the forming of the organic functional layer, there is an ink dropping point in the space between the one dam and the adjacent widthwise bank.

4. The method of claim 3, wherein
    the lengthwise banks partition the plurality of concave spaces from one another,
    in the forming of the organic functional layer, there are a plurality of ink dropping points along each of one or more ink dropping lines extending in the one direction, in each of the plurality of concave spaces, and
    the one dam is formed so that, in a concave space in which the one dam is formed, a length of at least one of the ink dropping lines in the space between the one dam and the adjacent widthwise bank is greater than a distance between the adjacent widthwise bank and an ink dropping point nearest the adjacent widthwise bank.

5. The method of claim 1 further comprising
    forming lengthwise banks extending in parallel in one direction along a surface of the substrate, the lengthwise banks partitioning the plurality of concave spaces from one another, wherein
    in each of the adjacent concave spaces between which one of the lengthwise banks having the bank defect portion is located, two dams are formed, the two dams extending from different ones of two points on the lengthwise bank having the bank defect portion to a lengthwise bank adjacent to the lengthwise bank having the bank defect portion, the two points being at different sides of the bank defect portion in the one direction,
    in the forming of the organic functional layer, there are a plurality of ink dropping points along each of one or more ink dropping lines extending in the one direction, in each of the plurality of concave spaces, the ink dropping lines intersecting with the two dams, and
    the two dams are formed so that along at least one of the ink dropping lines, a distance between the two dams is greater than a pitch of ink dropping points.

6. The method of claim 1 further comprising
    forming lengthwise banks extending in parallel in one direction along a surface of the substrate, the lengthwise banks partitioning the plurality of concave spaces from one another, wherein
    in each of the adjacent concave spaces between which one of the lengthwise banks having the bank defect portion is located, one dam is formed, the one dam extending from one to the other of two points on the lengthwise bank having the bank defect portion while detouring around the bank defect portion, the two points being at different sides of the bank defect portion in the one direction, in the forming of the organic functional layer, there are a plurality of ink dropping points along each of one or more ink dropping lines extending in the one direction, in each of the plurality of concave spaces, and the one dam is formed so that along at least one of the ink dropping lines that intersects the one dam at two positions of the one dam, a distance between the two positions of the one dam is greater than a pitch of ink dropping points.

7. The method of claim 6, wherein
the one dam comes in contact with a lengthwise bank adjacent to the lengthwise bank having the bank defect portion at some point along a path between the two points.

8. The method of claim 6, wherein
the one dam does not come in contact with a lengthwise bank adjacent to the lengthwise bank having the bank defect portion, and in a concave space in which the one dam is formed, a distance between the at least one of the ink dropping lines and the lengthwise bank having the bank defect portion is smaller than a separation distance that is a distance from the lengthwise bank having the bank defect portion to a portion of the one dam that is farthest from the lengthwise bank having the bank defect portion.

9. The method of claim 1, further comprising:
forming lengthwise banks extending in parallel in one direction along the surface of the substrate, the lengthwise banks partitioning the plurality of concave spaces from one another; and forming, in each of the plurality of concave spaces, widthwise banks having smaller height than the lengthwise banks, wherein the forming of the one or more dams is performed so that one or more dams are formed on the widthwise banks.

10. The method of claim 1, wherein
in the forming of the organic functional layer:
the ink is applied to each of the plurality of concave spaces by moving the nozzle head along the substrate while causing the nozzle head to eject the ink, and the presence of an ink dropping point in each of the first space and the second space is ensured by adjusting a position of the nozzle head in a direction along the substrate that is perpendicular to the direction in which the nozzle head is moved.

11. The method of claim 1, wherein
an organic light-emitting layer is one type of the organic functional layer.

* * * * *